United States Patent
Park et al.

(10) Patent No.: US 9,818,814 B2
(45) Date of Patent: Nov. 14, 2017

(54) ORGANIC LIGHT EMITTING DISPLAY DEVICES AND METHODS OF MANUFACTURING ORGANIC LIGHT EMITTING DISPLAY DEVICES

(71) Applicant: SAMSUNG DISPLAY CO., LTD., Yongin-si, Gyeonggi-Do (KR)

(72) Inventors: Sang-Ho Park, Suwon-si (KR); Seung-Min Lee, Jeju-si (KR); Hee-Jun Yoo, Yongin-si (KR); Joo-Sun Yoon, Seoul (KR); Yong-Jae Jang, Seoul (KR); Kwang-Young Choi, Incheon (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/143,153

(22) Filed: Apr. 29, 2016

(65) Prior Publication Data
US 2016/0322453 A1 Nov. 3, 2016

(30) Foreign Application Priority Data
Apr. 30, 2015 (KR) .................. 10-2015-0061738

(51) Int. Cl.
*H01L 27/32* (2006.01)
(52) U.S. Cl.
CPC ...... *H01L 27/3279* (2013.01); *H01L 27/3258* (2013.01)
(58) Field of Classification Search
CPC .............. H01L 27/3279; H01L 27/3211; H01L 2227/323
See application file for complete search history.

(56) References Cited

U.S. PATENT DOCUMENTS

2011/0073868 A1* 3/2011 Nakagawa .......... H01L 27/1214
257/72
2014/0239266 A1* 8/2014 Kim .................... H01L 51/0013
257/40

FOREIGN PATENT DOCUMENTS

| KR | 1020110085780 | 7/2011 |
|---|---|---|
| KR | 1020110087051 | 8/2011 |
| KR | 1020110111104 | 10/2011 |
| KR | 1020120069312 | 6/2012 |

* cited by examiner

*Primary Examiner* — Roy Potter
*Assistant Examiner* — Paul Patton
(74) *Attorney, Agent, or Firm* — F. Chau & Associates, LLC

(57) ABSTRACT

An organic light emitting display device includes a plurality of pixel regions on a substrate, each having a sub-pixel region, a transmissive region and a peripheral region, a plurality of sub-pixel circuits in the sub-pixel region that control the sub-pixel region, a planarization layer that covers the sub-pixel circuits, a first electrode disposed on the planarization layer in the sub-pixel region, a second electrode disposed on the first electrode, and a plurality of wirings disposed at different levels over the substrate in the peripheral region. The wirings are arranged in at least double level configuration and include first wirings that extend in a first direction over the substrate, and second wirings that extend over the substrate in a second direction substantially perpendicular to the first direction.

25 Claims, 22 Drawing Sheets

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION(S)

This application claims priority under 35 U.S.C. §119 from, and the benefit of, Korean patent Application No. 10-2015-0061738, filed on Apr. 30, 2015 in the Korean Intellectual Property Office, the contents of which are herein incorporated by reference in their entirety.

BACKGROUND

1. Technical Field

Exemplary embodiments of the disclosure are directed to organic light emitting display devices and methods of manufacturing organic light emitting display devices. More particularly, exemplary embodiments of the disclosure are directed to organic light emitting display devices having improves transmittances, and methods of manufacturing the organic light emitting display devices.

2. Discussion of the Related Art

An organic light emitting display device may generally display images by utilizing light generated from pixels thereof. In a conventional organic light emitting display device, different colors of light may be generated from organic light emitting layers containing different light emitting materials. For example, a conventional organic light emitting display device may include different types of organic light emitting layers for generating a red color, a green color and a blue color. A conventional organic light emitting display device may display images by utilizing different combinations of these colors.

Recently, a transparent organic light emitting display device has been developed by utilizing components such as transistors and light emitting structures which contain transparent materials. However, a transmissive region of a conventional transparent organic light emitting display device may not have a desired area due to wirings having a relatively large area, so that a conventional transparent organic light emitting display device may not have a sufficient transmittance for certain applications.

SUMMARY

Exemplary embodiments can provide an organic light emitting display device having an improved transmittance.

Exemplary embodiments can provide a method of manufacturing an organic light emitting display device having an improved transmittance.

According to an embodiment of the disclosure, there is provided an organic light emitting display device that including a plurality of pixel regions on a substrate, a plurality of of sub-pixel circuits, a planarization layer, a first electrode, a second electrode, and a plurality of wirings. Each pixel region includes a sub-pixel region, a transmissive region and a peripheral region. The plurality of sub-pixel circuits are disposed in the sub-pixel region and control the sub-pixel region. The planarization layer substantially covers the sub-pixel circuits. The first electrode is disposed on the planarization layer in the sub-pixel region. The second electrode is disposed on the first electrode. The wirings are disposed in at least a double level configuration at different levels over the substrate in the peripheral region.

In exemplary embodiments, the plurality of wirings may include first wirings that extend in a first direction over the substrate, and second wirings that extend in a second direction over the substrate that is substantially perpendicular to the first direction. Each sub-pixel circuit may include a plurality of transistors, and each transistor may include an active pattern, a gate electrode, a source electrode and a drain electrode.

In exemplary embodiments, the first wirings may include first lower wirings disposed on an insulating interlayer covering the gate electrode and first upper wirings disposed on the planarization layer.

In some exemplary embodiments, the first upper wirings do not overlap the first lower wirings.

In some exemplary embodiments, the first upper wirings may have widths substantially greater than widths of the first lower wirings.

In some exemplary embodiments, the first wirings may include first additional wirings disposed at a level over the substrate where the gate electrode is disposed.

In some exemplary embodiments, the first wirings may include first upper wirings disposed an insulating interlayer covering the gate electrode; and first lower wirings disposed at a level over the substrate where the gate electrode is disposed. The first upper wirings do not overlap the first lower wirings.

In some exemplary embodiments, the first lower wirings may be data wirings that transmit data signals to the sub-pixel circuits, and the first upper wirings may be power supply wirings that supply power to the sub-pixel circuits, or initialization voltage wirings that supply initialization voltages to the sub-pixel circuits.

In some exemplary embodiments, the first additional wirings, the first lower wirings and the first upper wirings may be selected from a group comprising data wirings that transmit data signals to the sub-pixel circuits, supply wirings that supply power to the sub-pixel circuits, and initialization voltage wirings that supply initialization voltages to the sub-pixel circuits.

In some exemplary embodiments, the second wirings may include second lower wirings disposed at a level over the substrate where the source and the drain electrodes are disposed, and second upper wirings disposed at a level over the substrate where the first electrode is disposed.

In some exemplary embodiments, the second lower wirings may be disposed on an insulating interlayer covering the gate electrode, and the second upper wirings may be disposed on the planarization layer, and the second upper wirings do not overlap the second lower wirings.

In some exemplary embodiments, the second lower wirings and the second upper wirings may be selected from a group comprising supply wirings that supply power to the sub-pixel circuits, and initialization voltage wirings that supply initialization voltages to the sub-pixel circuits, wirings that transmit light emitting signals, wirings that transmit scanning signals, and wirings that transmit gate initialization signals.

In exemplary embodiments, the planarization layer may have a transmissive window in the peripheral region.

According to another embodiment of the disclosure, there is provided a method of manufacturing an organic light emitting display device. In the method, a substrate having a sub-pixel region, a transmissive region and a peripheral region is provided, and then transistors are formed on the substrate in the sub-pixel region. Each transistor includes an active pattern, a gate electrode, a source electrode and a drain electrode. A planarization layer is formed on the substrate to cover the transistors. A first electrode is formed on the planarization layer, and a light emitting layer is formed on the first electrode. A second electrode is formed on the light emitting layer. A plurality of wirings is formed at different levels on the substrate in the peripheral region.

Forming the plurality of wirings according to exemplary embodiments may include forming first wirings that extend along a first direction on the substrate in the peripheral region, and forming second wirings that extend along a second direction on the substrate in the peripheral region. The second direction may be substantially perpendicular to the first direction.

In exemplary embodiments, the gate electrode may be formed on a first insulating interlayer covering the active pattern, and the source and the drain electrodes may be formed on a second insulating interlayer covering the gate electrode.

In exemplary embodiments, forming the first wirings may include forming first lower wirings on the second insulating interlayer, and forming first upper wirings on the planarization layer. The first lower wirings and the source and the drain electrodes may be simultaneously formed. In addition, the first upper wirings and the first electrode may be simultaneously formed.

In exemplary embodiments, forming the first wirings may include forming first additional wirings on the insulating interlayer. The additional wirings and the gate electrode may be simultaneously formed.

In exemplary embodiments, forming the second wirings may include forming second lower wirings on the insulating interlayer, and forming second upper wirings on the planarization layer.

In exemplary embodiments, the second lower wirings and the source and the drain electrodes may be simultaneously formed. Further, the second upper wirings and the first electrode may be simultaneously formed.

According to another embodiment of the disclosure, there is provided an organic light emitting display device that includes a plurality of pixel regions on a substrate, a planarization layer, a first electrode, a second electrode, and a plurality of wirings. Each of the plurality of pixel regions includes a sub-pixel region, a transmissive region and a peripheral region. The planarization layer covers the plurality of sub-pixel circuits, the a first electrode is disposed on the planarization layer in the sub-pixel region, the second electrode is disposed on the first electrode, and the plurality of wirings are disposed in at least a double level configuration at different levels over the substrate in the peripheral region. The plurality of wirings includes first wirings that extend in a first direction over the substrate, and second wirings that extend in a second direction over the substrate, the second direction being substantially perpendicular to the first direction.

In exemplary embodiments, the organic light emitting display device may further includes a plurality of sub-pixel circuits in the sub-pixel region that control the sub-pixel region, wherein each sub-pixel circuit includes a plurality of transistors, each transistor including an active pattern, a gate electrode, a source electrode and a drain electrode, and a light emitting layer between the first electrode and the second electrode. The planarization layer may include a transmissive window in the transmissive region.

In exemplary embodiments, the first wirings may further include first additional wirings disposed at a level over the substrate where the gate electrode is disposed.

In exemplary embodiments, the first wirings may include first upper wirings disposed an insulating interlayer covering the gate electrode; and first lower wirings disposed at a level over the substrate where the gate electrode is disposed, where the first upper wirings do not overlap the first lower wirings.

In exemplary embodiments, the second wirings may include second lower wirings may be disposed at a level over the substrate where the source and the drain electrodes are disposed; and second upper wirings may be disposed at a level over the substrate where the first electrode is disposed. The second lower wirings may be disposed on an insulating interlayer covering the gate electrode, and the second upper wirings may be disposed on the planarization layer, and the second upper wirings do not overlap the second lower wirings.

According to exemplary embodiments, the organic light emitting display device may include the plurality of wirings disposed in the peripheral region of the pixel in at least a double level configuration. Therefore, the area occupied by the wirings may can be decreased while the area of the transmissive region may be increased. As a result, an organic light emitting display device may have increased transmittance.

DETAILED DESCRIPTION OF THE EMBODIMENTS

Figure 1:
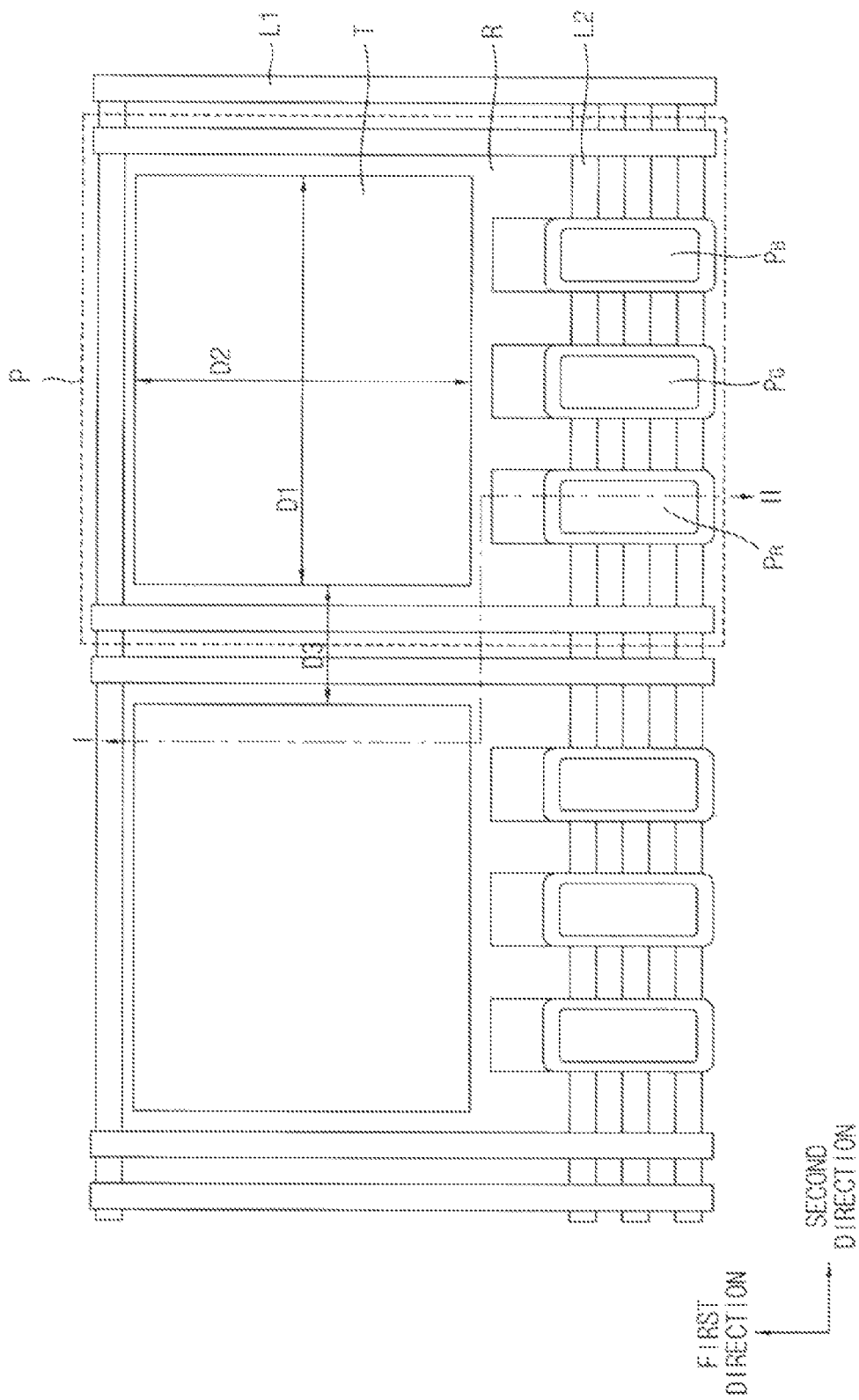
FIG. 1 is a plan view of an organic light emitting display device in accordance with exemplary embodiments.

Hereinafter, organic light emitting display devices and methods of manufacturing organic light emitting display devices in accordance with exemplary embodiments will be described in detail with reference to the accompanying drawings. The disclosure may, however, be embodied in many different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals may refer to like or similar elements throughout.

FIG. 1 is a plan view of an organic light emitting display device in accordance with exemplary embodiments.

Referring to FIG. 1, an organic light emitting display device according to an embodiment of the disclose includes a plurality of pixels P arranged on a substrate in a first direction and a second direction. Each pixel P includes a first sub-pixel $P_R$, a second sub-pixel $P_G$ and a third sub-pixel $P_B$, a transmissive region T, and a peripheral region R. The first sub-pixel $P_R$, the second sub-pixel $P_G$ and the third sub-pixel $P_B$ respectively generate a red color, a green color and a blue color. For example, light emitting structures included in the first to the third sub-pixels $P_R$, $P_G$ and $P_B$ emit red, green and blue colors, respectively.

In exemplary embodiments, each of the first sub-pixel $P_R$, the second sub-pixel $P_G$ and the third sub-pixel $P_B$ extend along the first direction. Each of the first to the third sub-pixels $P_R$, $P_G$ and $P_B$ may have a substantially rectangular shape, a substantially elliptical shape, a substantially hyperelliptical shape, etc. Here, a length of the first sub-pixel $P_R$ along the first direction is substantially greater than a length of the first sub-pixel $P_R$ along the second direction. In addition, a length of the second sub-pixel $P_G$ in the first direction is substantially greater than a length of the second sub-pixel $P_G$ in the second direction. Furthermore, a length of the third sub-pixel $P_B$ along the first direction is substantially greater than a length of the third sub-pixel $P_B$ along the second direction. In some exemplary embodiments, the first sub-pixel $P_R$, the second sub-pixel $P_G$ and the third sub-pixel $P_B$ are arranged along the second direction on the substrate. For example, the first sub-pixel $P_R$, the second sub-pixel $P_G$ and the third sub-pixel $P_B$ are separated by predetermined distances in the second direction.

According to some exemplary embodiments, the third sub-pixel $P_B$ may have an area substantially the same as an area of the first sub-pixel $P_R$ and/or an area of the second sub-pixel $P_G$. Alternatively, the third sub-pixel $P_B$ may have an area substantially greater than that of the first sub-pixel $P_R$ and/or that of the second sub-pixel $P_G$.

As illustrated in FIG. 1, the transmissive region T is spaced apart from the first to the third sub-pixels $P_R$, $P_G$ and $P_B$ along the first direction. The transmissive region T has a first length D1 in the first direction, and a second length D2 along the second direction. For example, an area of the transmissive region T can be defined by the product of the first length D1 and the second length D2 when the transmissive region T has a substantially rectangular shape. In exemplary embodiments, the area of the transmissive region T may be from about 20% to about 90% of an area of the pixel P. As the area of the transmissive region T increases, the transmittance of an organic light emitting display device according to embodiments of the disclosure increases.

In some exemplary embodiments, adjacent first to third sub-pixels $P_R$, $P_G$ and $P_B$ share one transmissive region T along the first direction. For example, the first to the third sub-pixels $P_R$, $P_G$ and $P_B$ may be arranged adjacent to one transmissive region T. In other embodiments, an organic light emitting display device may have a configuration in which two adjacent pixels P may share one transmissive region T.

In exemplary embodiments, the peripheral region R substantially surrounds the transmissive region T and the first to the third sub-pixels $P_R$, $P_G$ and $P_B$. For example, the peripheral region R corresponds to a remaining region of the pixel P excepting the transmissive region T and the first to the third sub-pixels $P_R$, $P_G$ and $P_B$.

Referring now to FIG. 1, an organic light emitting display device according to exemplary embodiments includes first wirings L1 and second wirings L2 disposed in the peripheral region R, which are electrically connected to circuits positioned in the pixels P. The light emitting structures and sub-pixel circuits for controlling the lightning emitting structures are disposed in the first to the third sub-pixels $P_R$, $P_G$ and $P_B$, where the first and second wirings L1 and L2 are electrically connected to the sub-pixel circuits. The sub-pixel circuits will be described with reference to FIG. 2.

The first wirings L1 extend in the first direction. The first wirings L1 are separated on the substrate by predetermined distances along the second direction. In exemplary embodiments, the first wirings L1 are located along the second direction between adjacent pixels P. In this case, the first wirings L1 do not substantially overlapped the transmissive region T or the first to the third sub-pixels $P_R$, $P_G$ and $P_B$.

The second wirings L2 extend along the second direction, and are separated on the substrate by predetermined distances in the first direction. According to exemplary embodiments, the second wirings L2 partially overlap the first to the third sub-pixels $P_R$, $P_G$ and $P_B$ but do not substantially overlap the transmissive region T.

As illustrated in FIG. 1, a distance D3 between the transmissive regions T of adjacent pixels P in the second direction can be determined based on dimensions of the first wirings L1 positioned between the transmissive regions T. That is, when an area occupied by the first wirings L1 increases, the distance D3 between the transmissive regions T in the second direction may also increase, thereby reducing the first length D1 of the transmissive region T. On the other hand, as the distance D3 between the transmissive regions T in the second direction decreases, the first length D1 of the transmissive region T may increase to thereby increase the area of the transmissive region T. As a result, an organic light emitting display device according to embodiments of the disclosure can have an improved transmittance.

According to exemplary embodiments, the first wirings L1 have a multi level configuration on the substrate. In this case, the distance D3 between adjacent transmissive regions T may be substantially less than the sum of widths of respective wirings included in the first wirings L1. That is, when the first wirings L1 have a multi level configuration, the distance D3 between the transmissive regions T along the second direction is reduced as compared with wirings having a single level configuration. Therefore, an organic light emitting display device according to an exemplary embodiment can have an improved transmittance because the transmissive region T has an increased area.

Figure 2:
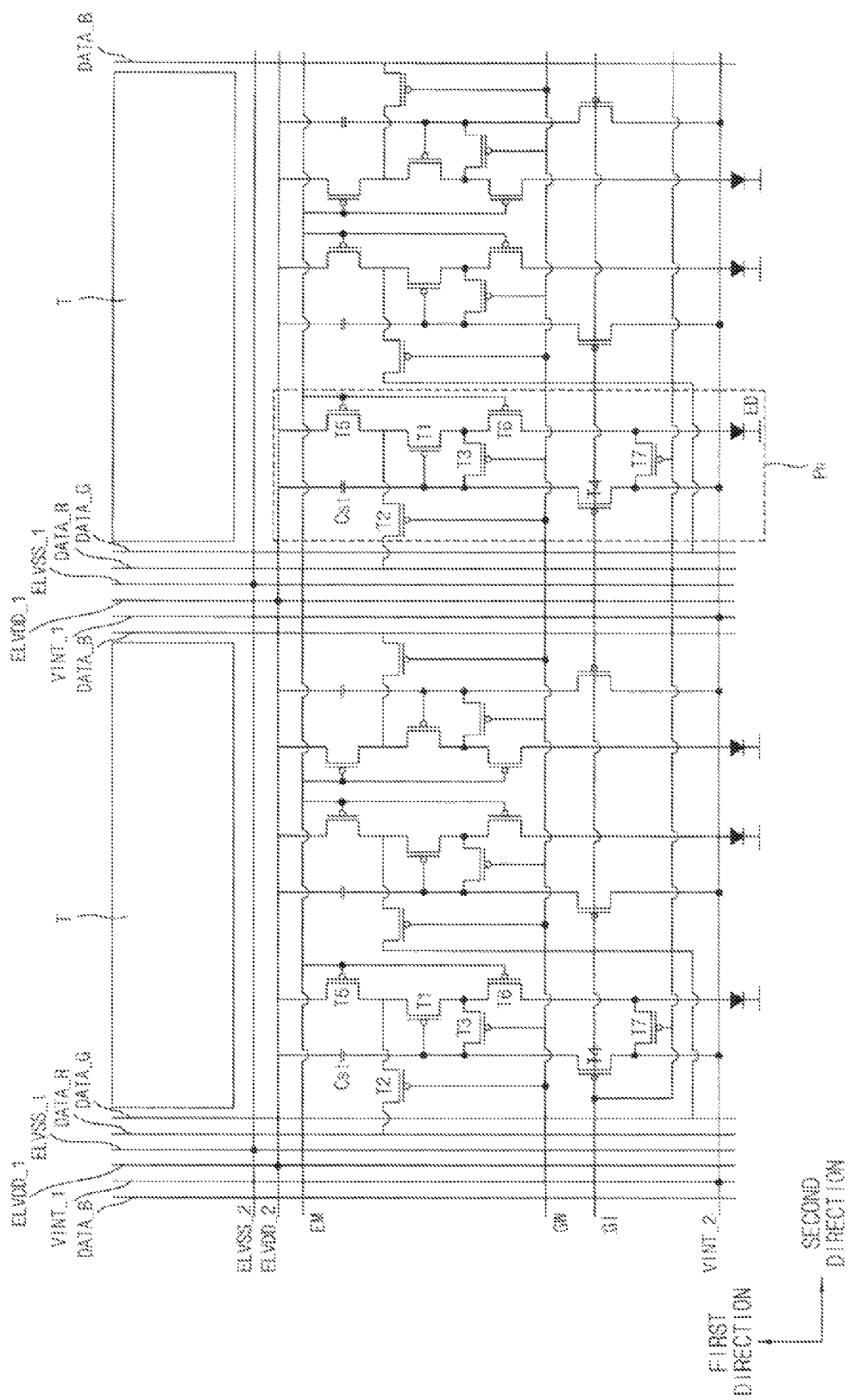
FIG. 2 is a circuit diagram of an organic light emitting display device in accordance with exemplary embodiments.

FIG. 2 is a circuit diagram of an organic light emitting display device in accordance with exemplary embodiments.

Referring to FIG. 2, in some embodiments, an organic light emitting display device includes a plurality of pixels P (see FIG. 1) arranged in the first direction and the second direction. In exemplary embodiments, each pixel P has, as illustrated in FIG. 1, a first sub-pixel $P_R$, a second sub-pixel $P_G$, a third sub-pixel $P_B$, a transmissive region T, and a peripheral region R.

Sub-pixel circuits are disposed in the first to the third sub-pixels $P_R$, $P_G$ and $P_B$, as illustrated. In exemplary embodiments, each of the sub-pixel circuits includes a plurality of transistors, at least one capacitor, a light emitting structure, etc. In exemplary embodiments, each sub-pixel circuit includes, as illustrated in FIG. 2, seven transistors T1, T2, T3, T4, T5, T6 and T7, one capacitor Cst, and one light emitting structure ED. Embodiments of the disclosure are not limited to such a configuration, however, and each sub-pixel circuit may include more or less than seven transistors, more than one capacitor and/or more than one light emitting structure as occasion demands.

As illustrated in FIG. 2, the sub-pixel circuits are electrically connected to a plurality of first wirings extending in the first direction, and are also electrically connected to a plurality of second wirings extending along the second direction. The first wirings include a first data wiring DATA_R, a second data wiring DATA_G, a third data wiring DATA_B, a first initialization voltage wiring VINT_1, a first high voltage power supply wiring ELVDD_1, and a first low voltage power supply wiring ELVSS_1.

In exemplary embodiments, the first to third data wirings DATA_R, DATA_G and DATA_B transmit data signals to the pixels P, and thus correspond to all of the pixels P. Here, the first data wiring DATA_R, the second data wiring DATA_G, and the third data wiring DATA_B are respectively electrically connected to a second transistor T2 in the first sub-pixel $P_R$ of each pixel P, a second transistor T2 in the second sub-pixel $P_G$ of the pixel P, and a second transistor T2 in the third sub-pixel $P_B$ of the pixel P. The first to the third data wirings DATA_R, DATA_G and DATA_B transmit data signals to the sub-pixel circuits in the first to the third sub-pixels $P_R$, $P_G$ and $P_B$.

In addition, the first initialization voltage wiring VINT_1, the first high voltage power supply wiring ELVDD_1 and the first low voltage power supply wiring ELVSS_1 correspond to all of the pixels P. In exemplary embodiments, the first initialization voltage wiring VINT_1 is electrically connected to each pixel P through a second initialization voltage wiring VINT_2. The first initialization voltage wiring VINT_1 can apply initialization voltages to a fourth transistor T4 and a seventh transistor T7 of each sub-pixel circuit.

In exemplary embodiments, the first high voltage power supply wiring ELVDD_1 is electrically connected to each pixel P through a second high voltage power supply wiring ELVDD_2. The first high voltage power supply wiring ELVDD_1 can supply high voltages to the capacitor Cst and a fifth transistor T5 of each sub-pixel circuit.

In exemplary embodiments, the first low voltage power supply wiring ELVSS_1 is electrically connected to each pixel P through a second low voltage power supply wiring ELVSS_2. The first low voltage power supply wiring ELVSS_1 can apply low voltages to the light emitting structure ED of each sub-pixel circuit.

In exemplary embodiments, as illustrated in FIG. 2, the first wirings DATA_R, DATA_G, DATA_B, VINT_1, ELVDD_1 and ELVSS_1 do not substantially overlap adjacent transmissive regions T. When an area occupied by the first wirings DATA_R, DATA_G, DATA_B, VINT_1, ELVDD_1 and ELVSS_1 between adjacent pixels P is increased to dispose the first wirings DATA_R, DATA_G, DATA_B, VINT_1, ELVDD_1 and ELVSS_1 at the same level on a substrate, a length of the transmissive region T in the second direction may be reduced, thereby decreasing an area of the transmissive region T. On the other hand, when the area occupied by the first wirings DATA_R, DATA_G, DATA_B, VINT_1, ELVDD_1 and ELVSS_1 is reduced, the area of the transmissive region T can be increased to improve a transmittance of an organic light emitting display device. Various configurations of the first wirings DATA_R, DATA_G, DATA_B, VINT_1, ELVDD_1 and ELVSS_1 will be described with reference to FIGS. 3 to 6.

As illustrated in FIG. 2, the second wirings include the second low voltage power supply wiring ELVSS_2, the second high voltage power supply wiring ELVDD_2, the second initialization voltage wiring VINT_2, a wiring EM for a light emitting signal, a wiring GW for a scanning signal, and a wiring GT for a gate initialization signal.

In exemplary embodiments, the second low voltage power supply wiring ELVSS_2 extends along the second direction, and is connected to the first low voltage power supply wiring ELVSS_1. For example, to transmit a low voltages to each pixel P, the first low voltage power supply wiring ELVSS_1 and the second low voltage power supply wiring ELVSS_2 cross each other, and are arranged in a mesh configuration. Therefore, electrical resistances of the first and second low voltage power supply wirings ELVSS_1 and ELVSS_2 can be substantially reduced. In addition, the second low voltage power supply wiring ELVSS_2 is electrically connected to first ends of the light emitting structures ED in the first to the third sub-pixels $P_R$, $P_G$ and $P_B$ of each pixel P. Thus, the second low voltage power supply wiring ELVSS_2 can transmit lower voltages to the light emitting structures ED in the first to the third sub-pixels $P_R$, $P_G$ and $P_B$.

In exemplary embodiments, the first high voltage power supply wiring ELVDD_1 and the second high voltage power supply wiring ELVDD_2 are connected to each other. To apply a high voltage to each pixel P, the first and second high voltage power supply wirings ELVDD_1 and ELVDD_2 cross in the first and second directions, so that electrical resistances of the first and second high voltage power supply wirings ELVDD_1 and ELVDD_2 can be substantially reduced. The second high voltage power supply wirings ELVDD_2 is electrically connected to the fifth transistor T5 and the storage capacitor Cst of each sub-pixel circuit. The second high voltage power supply wirings ELVDD_2 can transmit high voltages to the sub-pixel circuits.

In exemplary embodiments, the second initialization voltage wiring VINT_2 is connected to the first initialization voltage wiring VINT_1. For example, the first initialization voltage wiring VINT_1 crosses the second initialization voltage wiring VINT_2 along the first and the second directions to transmit initialization voltages to the pixels P. Hence, electrical resistances of the first and second initialization voltage wiring VINT_1 and VINT_2 can be reduced.

In addition, as illustrated in FIG. 2, the wiring EM for the light emitting signal, the wiring GW for the scanning signal and the wiring GT for the gate initialization signal are electrically connected to the sub-pixel circuits along the second direction.

Figure 3:
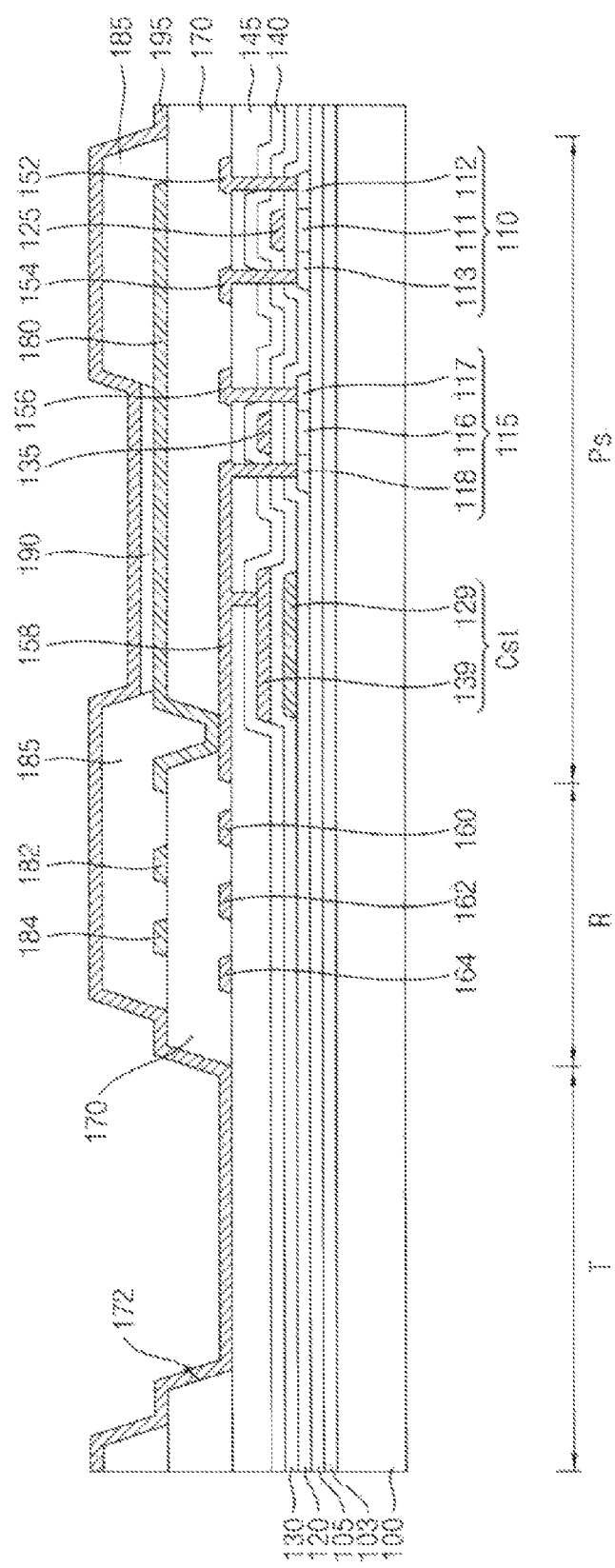
FIG. 3 is a cross-sectional view of an organic light emitting display device in accordance with exemplary embodiments.

FIG. 3 is a cross-sectional view of an organic light emitting display device in accordance with exemplary embodiments. FIG. 3 is a cross-section of an organic light emitting display device taken along a line of I-II in FIG. 1.

Referring to FIG. 3, an organic light emitting display device includes transistors, capacitors Cst, first wirings, second wirings, a first electrode 180, a light emitting layer 190 and a second electrode 195, on a substrate 100. In exemplary embodiments, the first wirings include first lower wirings 160, 162 and 164, and first upper wirings 182 and 184. In additional, the second wirings are substantially the same as or similar to the second wirings described with reference to FIGS. 1 and 2. Furthermore, a light emitting structure includes the first electrode 180, the light emitting layer 190 and the second electrode 195.

The substrate 100 include a transparent insulation substrate. For example, the substrate 100 may include a glass substrate, a quartz substrate, a transparent plastic substrate, etc. Alternatively, the substrate 100 may include a transparent flexible substrate.

In exemplary embodiments, the substrate 100 has a sub-pixel region Ps, a transmissive region T, a peripheral region R, etc. Here, as illustrated in FIG. 1, the peripheral region R substantially surrounds the sub-pixel region Ps and the transmissive region T.

In exemplary embodiments, a first barrier layer 103 and a second barrier layer 105 are disposed on the substrate 100. The first and the second barrier layers 103 and 105 can prevent diffusion of impurities and/or ions through the substrate 100. Further, the first and the second barrier layers 103 and 105 can substantially planarize a surface of the substrate 100. In addition, each of the first and the second barrier layers 103 may include an inorganic material such as silicon oxide, silicon nitride, silicon oxynitride, aluminum oxide, aluminum nitride, titanium oxide, and titanium nitride and/or an organic material such as polyimide, polyester, acryl, etc. In some exemplary embodiments, the first barrier layer 103 includes silicon nitride, and the second barrier layer 105 includes silicon oxide. Alternatively, in other exemplary embodiments, the first barrier layer 103 and/or the second barrier layer 105 are omitted based on materials, dimensions and manufacturing conditions of the substrate 100. For example, when one barrier layer is provided on the substrate 100, such barrier layer may have a single layer structure or a multi layer structure which includes the above inorganic material and/or the above organic material.

As illustrated in FIG. 3, a first active pattern 110 and a second active pattern 115 may be disposed on the second barrier layer 105, or alternatively on the substrate 100. The first and the second active patterns 110 and 115 are positioned in the sub-pixel region Ps of the substrate 100. The first active pattern 110 includes a first source region 112, a first drain region 113 and a first channel region 111. The second active pattern 115 includes a second source region 117, a second drain region 118 and a second channel region 116.

Each of the first and the second active patterns 110 and 115 may include a single crystalline silicon, a polycrystalline silicon, an oxide semiconductor, etc. For example, each of the first and the second active patterns 110 and 115 may include an oxide semiconductor that includes a binary compound (ABx), a ternary compound (ABxCy) or a quaternary compound (ABxCyDz), which may contain indium (In), zinc (Zn), gallium (Ga), tin (Sn), titanium (Ti), aluminum (Al), hafnium (Hf), zirconium (Zr), etc. Here, each of the first and the second active patterns 110 and 115 may be, for example, a GIZO $[(In_2O_3)_a(Ga_2O_3)_b(ZnO)_c]$ layer, where $a≥0$, $b≥0$ and $c>0$.

In exemplary embodiments, a gate insulation layer 120 substantially covers the first and the second active patterns 110 and 115, and may be disposed on the second barrier layer 105 or the substrate 100. In addition, the gate insulation layer 120 may include silicon oxide, metal oxide, etc. In exemplary embodiments, the first and the second active patterns 110 and 115 are substantially enclosed by the gate insulation layer 120 and the second barrier layer 105, both of which may include silicon oxide. In particular, when the first and the second active patterns 110 and 115 include silicon oxide, each of the first and the second active patterns 110 and 115 can have an improved interfacial stability relative to the gate insulation layer 120 and the second barrier layer 105.

In exemplary embodiments, a first gate electrode 125 and a first conductive pattern 129 are disposed on the gate insulation layer 120. In exemplary embodiments, the first gate electrode 125 is disposed on the first channel region 111 of the first active pattern 110. The first conductive pattern 129 and the first gate electrode 125 are positioned in the sub-pixel region Ps. In addition, each of the first gate electrode 125 and the first conductive 129 may include a metal, a metal nitride, an alloy, a conductive metal oxide, a transparent conductive material, etc.

In exemplary embodiments, a first insulating interlayer 130 is disposed on the gate insulation layer 120 to substantially cover the first gate electrode 125 and the first conductive pattern 129. In addition, the first insulating interlayer 130 may include silicon nitride, silicon oxynitride, etc.

Referring to FIG. 3 again, a second gate electrode 135 and a second conductive pattern 139 are disposed on the first insulating interlayer 130. In exemplary embodiments, the second gate electrode 135 is disposed on the second channel region 116 of the second active pattern 115, and the second conductive pattern 139 is disposed on the first conductive pattern 129. In addition, each of the second conductive 139 and the second gate electrode 135 may include a metal, a metal nitride, an alloy, a conductive metal oxide, a transparent conductive material, etc.

In exemplary embodiments, the capacitor Cst includes the first conductive 129, the second conductive pattern 139 and a portion of the first insulating interlayer 130 interposed between the first and the second conductive patterns 129 and 139. When the first insulating interlayer 130 includes silicon nitride, the capacitor Cst can have a capacitance substantially larger than that of a capacitor including an insulating interlayer of silicon oxide.

In exemplary embodiments, a second insulating interlayer 140 is disposed on the first insulating interlayer 130 to substantially cover the second gate electrode 135 and the second conductive pattern 139. In addition, the second insulating interlayer 140 may include silicon oxide.

In exemplary embodiments, a third insulating interlayer 145 is disposed on the second insulating interlayer 140. In addition, the third insulating interlayer 145 may include silicon nitride, silicon oxynitride, etc.

In exemplary embodiments, a first source electrode 152, a first drain electrode 154, a second source electrode 156, a second drain electrode 158 and the first lower wirings 160, 162 and 164 are disposed on the third insulating interlayer 145. In exemplary embodiments, the first lower wiring 160, 162 and 164, the first source electrode 152, the first drain electrode 154, the second source electrode 156, and the second drain electrode 158 are positioned at the same level over the substrate 100. The first source electrode 152 and the first drain electrodes 154 pass through the first to the third insulating interlayers 130, 140 and 145 and the gate insulation layer 120 to contact the first source region 112 and the first drain region 113, respectively. In additional, the second source electrode 156 and the second drain electrodes 158 pass through the first to the third insulating interlayers 130, 140 and 145 and the gate insulation layer 120 to contact the second source region 117 and the second drain region 118, respectively. Furthermore, the second drain electrode 158 passes through the second and the third insulating interlayers 140 and 145 to contact the second conductive pattern 139. Therefore, the capacitor Cst is electrically connected to the transistor having the second source and drain electrodes 156 and 158.

According to exemplary embodiments, a first transistor includes the first source and drain electrodes 152 and 154, the first active pattern 110 and the first gate electrode 125. Further, a second transistor includes the second source and drain electrodes 156 and 158, the second active pattern 115 and the second gate electrode 135. In exemplary embodiments, the first transistor is a switching transistor, and the second transistor is a driving transistor.

FIG. 3 shows the transistors as having top-gate structures in which the first and the second gate electrodes 125 and 135 are positioned over the first and the second active patterns 110 and 115, respectively. However, one or both of the transistors may have a bottom gate structure in which a gate electrode is disposed under an active pattern.

As illustrated in FIG. 3, the first lower wirings 160, 162 and 164 are disposed on the third insulating interlayer 145 in the peripheral region R. In addition, the first lower wirings 160, 162 and 164, the first and the second source electrodes 152 and 156, and the first and the second drain electrodes 154 and 158 may include the same materials. For example, each of the first lower wirings 160, 162 and 164, the first and the second source electrodes 152 and 156, and the first and the second drain electrodes 154 and 158 may include copper (Cu), aluminum (Al), platinum (Pt), silver (Ag), gold (Au), magnesium (Mg), chrome (Cr), tungsten (W), molybdenum (Mo), titanium (Ti), an alloy thereof, etc.

According to exemplary embodiments illustrated in FIG. 3, three first lower wirings 160, 162 and 164 are disposed on the third insulating interlayer 145 in the peripheral region R, however, embodiments of the disclosure are not limited to this configuration. For example, more or fewer than three first lower wirings may be disposed on the third insulating interlayer 145 in the peripheral region R.

According to exemplary embodiments, a planarization layer 170 is disposed on the third insulating interlayer 145 to substantially cover the transistors, the capacitor Cst and the first lower wirings 160, 162 and 164. In exemplary embodiments, a transmissive window 172 is provided to form an opening through the planarization layer 170 in the transmissive region T. The transmissive window 172 can be defined by an upper surface of the third insulating interlayer 145 and a sidewall of the opening of the planarization layer 170. The transmissive window can improve the transmittance of the transmissive region T of an organic light emitting display device according to embodiments of the disclosure.

According to exemplary embodiments, the first electrode 180 and the first upper wirings 182 and 184 are disposed on the planarization layer 170. The first electrode 180 is positioned in the sub-pixel region Ps, and is electrically connected to the second drain electrode 158 through the planarization layer 170. In addition, the first electrode 180 may include a metal, an alloy, a metal nitride, a conductive metal oxide, a transparent conductive material, etc.

According to exemplary embodiments, the first upper wirings 182 and 184 are disposed on the planarization layer 170 in the peripheral region R. The first upper wirings 182 and 184 and the first electrode 180 are located at the same level over the substrate 100. In addition, each of the first upper wirings 182 and 184 may include a material substantially the same as that of the first electrode 180. For example, each first upper wirings 182 and 184 may include a metal, an alloy, a metal nitride, a conductive metal oxide, a transparent conductive material, etc.

In an organic light emitting display device illustrated in FIG. 3, the first lower wirings 160, 162 and 164 may be the data wirings described with reference to FIG. 2, and the first upper wirings 182 and 184 may be the wirings associated with the power supply or the wirings associated with the initialization voltage described with reference to FIG. 2. For example, one of the first lower wirings 160, 162 and 164 may be the first data wiring DATA_R illustrated in FIG. 2, and another of the first lower wirings 160, 162 and 164 may be the second data wiring DATA_G illustrated in FIG. 2. In addition, the other of the first lower wirings 160, 162 and 164 may be the third data wiring DATA_B illustrated in FIG. 2. In addition, one of the first upper wiring 182 and 184 may be the first initialization voltage wiring VINT_1 illustrated in FIG. 2, and the other of the first upper wiring 182 and 184 may be the first high voltage power supply wiring ELVDD_1 or a first lower voltage power supply wiring ELVSS_1 illustrated in FIG. 2.

In some exemplary embodiments, the first upper wirings 182 and 184 are the data wirings described with reference to FIG. 2 when the first lower wirings 160, 162 and 164 are the wirings associated with the power supply or the wirings associated with the initialization voltage described with reference to FIG. 2. For example, one of the first lower wirings 160, 162 and 164 may be the first initialization voltage wiring VINT_1 illustrated in FIG. 2, another of the first lower wirings 160, 162 and 164 may be the first high voltage power supply wiring ELVDD_1 in FIG. 2, and the other of the first lower wirings 160, 162 and 164 may be the first low voltage power supply wiring ELVSS_1. Further, first upper wirings 182 and 184 may be respective one of the data wirings DATA_R, DATA_G and DATA_B illustrated in FIG. 2.

In the exemplary embodiments illustrated in FIG. 3, two first upper wirings 182 and 184 are disposed on the planarization layer 170 in the peripheral region R, however, embodiments of the disclosure are not limited to such a configuration. For example, more or fewer than two first upper wirings may be provided on the planarization layer 170 in the peripheral region R.

In exemplary embodiments, a pixel defining layer 185 is disposed on the planarization layer 170, and covers the first upper wirings 182 and 184 while partially covering the first electrode 180. In addition, the pixel defining layer 185 may include an organ material such as polyimide. The pixel defining layer 185 is positioned in the sub-pixel region Ps and the peripheral region R and not in the transmissive region T. An opening is provided through the pixel defining layer 185 on the transmissive window 172 in the transmissive region T. Thus, the transmittance of the transmissive region T can be more improved.

In exemplary embodiments, the light emitting layer 190 is disposed on the first electrode 180 exposed by a pixel opening of the pixel defining layer 185. The light emitting layer 190 may include at least organic light emitting layer. Further, the light emitting layer 190 may alternatively include a hole injection layer, a hole transfer layer, an electron injection layer, an electron transfer layer, etc. Light generated from the light emitting layer 190 propagates in a direction toward the substrate 100 and in a direction away from the substrate 100. In an organic light emitting display device illustrated in FIG. 3, the light emitting layer 190 substantially overlaps the transistor and/or the capacitor Cst, so that the light propagating toward the substrate 100 can be blocked by the transistors and/or the capacitor Cst. That is, an organic light emitting display device may be a top emission type in which light generated from the light emitting layer 190 is emitted toward a front of the organic light emitting display device after propagating through the second electrode 195.

In exemplary embodiments, the second electrode 195 is disposed on the light emitting layer 190 and the pixel defining layer 185. In addition, the second electrode 195 may include aluminum (Al), platinum (Pt), silver (Ag), gold (Au), magnesium (Mg), chrome (Cr), tungsten (W), molybdenum (Mo), titanium (Ti), an alloy thereof, etc.

According to exemplary embodiments, the first lower wirings 160, 162 and 164 are disposed at the same level as the first and the second source electrodes 152 and 156, and the first and the second drain electrodes 154 and 158. In addition, the first upper wirings 182 and 184 are disposed at the same level as the first electrode 180. In particular, the first lower wirings 160, 162 and 164, and the first upper wirings 182 and 184 are disposed at different levels over the substrate 100. For example, the first lower wirings 160, 162 and 164, and the first upper wirings 182 and 184 may be arranged in a multi level configuration over the substrate 100. Thus, an area occupied by the first lower wirings 160, 162 and 164, and the first upper wirings 182 and 184 can be reduced in comparison with conventional wirings of an organic light emitting display device, which can increase the length D1 of the transmissive region T of an organic light emitting display device. As a result, an organic light emitting display device according to an exemplary embodiment can improve transmittance by increasing the area of the transmissive region T.

Figure 4:
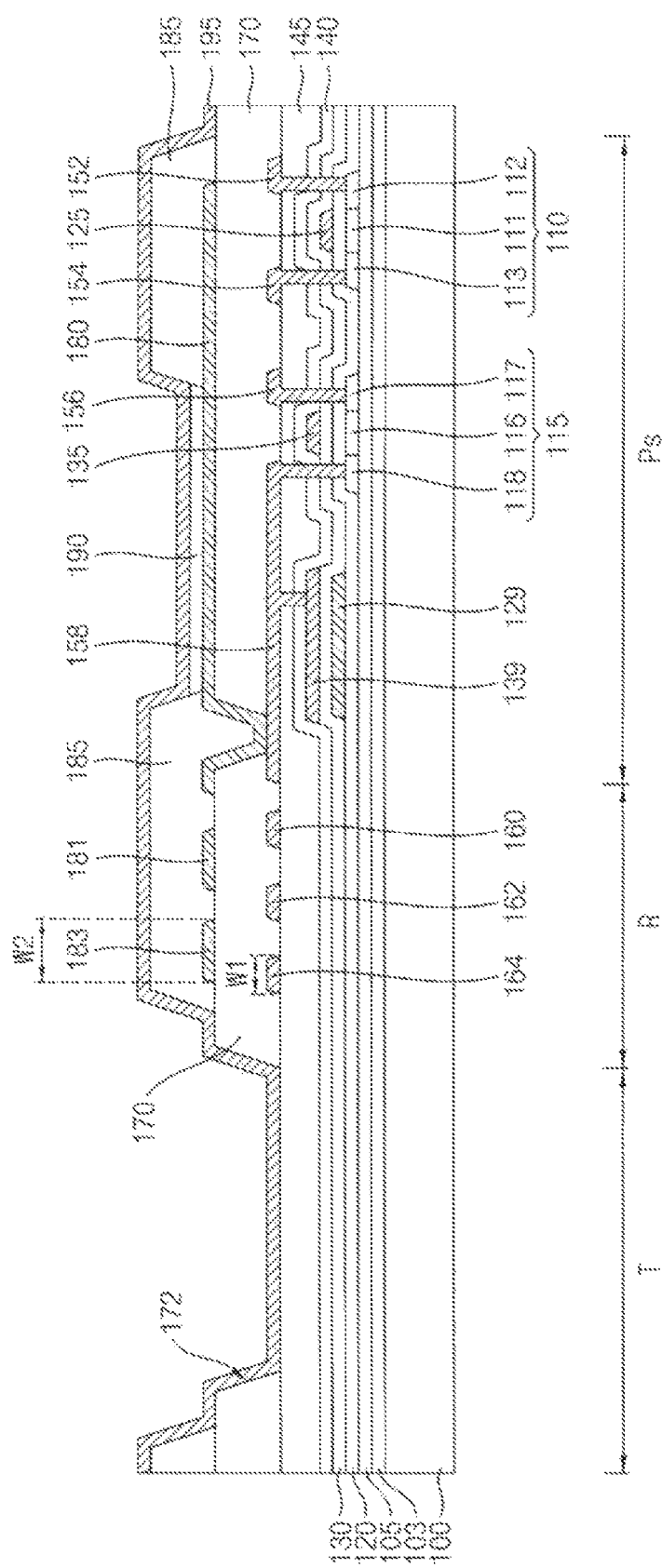
FIG. 4 is a cross-sectional view of an organic light emitting display device in accordance with some exemplary embodiments.

FIG. 4 is a cross-sectional view of an organic light emitting display device in accordance with some exemplary embodiments. An organic light emitting display device of FIG. 4 has a configuration substantially the same as or similar to that of an organic light emitting display device described with reference FIG. 3 except for wirings 181 and 183. In FIG. 4, like or similar reference numerals may indicate like or similar elements illustrated in FIG. 3.

Referring to FIG. 4, an organic light emitting display device according to an exemplary embodiment includes capacitors, first wirings, second wirings, a first electrode 180, a light emitting layer 190, and a second electrode 195. In this case, the first wirings include first lower wirings 160, 162 and 164 and first upper wirings 181 and 183. In addition, the second wirings are substantially the same as the second wirings described with reference to FIGS. 1 and 2.

According to exemplary embodiments, the first lower wirings 160, 162 and 164 are disposed on a third insulating interlayer 145 in a peripheral region R. The first lower wirings 160, 162 and 164, a first source electrode 152, a second source electrode 156, a first drain electrode 154 and a second drain electrode 158 are positioned at the same level over a substrate 100. In addition, each of the first lower wirings 160, 162 and 164, the first and second source electrodes 152 and 156, and the first and the second drain electrodes 154 and 158 may include copper, aluminum, platinum, silver, gold, magnesium, chrome, tungsten, molybdenum, titanium, alloy thereof, etc.

According to exemplary embodiments, the first upper wirings 181 and 183 are disposed on a planarization layer 170 in the peripheral region R. The first upper wirings 181 and 183 and a first electrode 180 are located at the same level over the substrate 100. In addition, each of the first electrode 180 and the first upper wirings 181 and 183 may include metal, alloy, metal nitride, conductive metal oxide, transparent conductive material, etc.

In exemplary embodiments, the first lower wirings 160, 162 and 164 and the first upper wirings 181 and 183 are arranged in a multi level configuration wherein they are disposed at different levels over the substrate 100. Each of the first lower wirings 160, 162 and 164 can have a first width W1 and each of the first upper wirings 181 and 183 can have a second width W2 substantially greater than the first width W1. When each of the first upper wirings 181 and 183 includes a transparent conductive material, each of the first upper wirings 181 and 183 has a specific resistance substantially higher than that of each of the first lower wirings 160, 162 and 164. Here, the first upper wirings 181 and 183 have relatively larger second widths W2, so that the relative high specific resistances of the first upper wirings 181 and 183 can be compensated by the relatively larger second widths W2. Therefore, the first upper wirings 181 and 183 can have desired electrical resistances.

Figure 5:
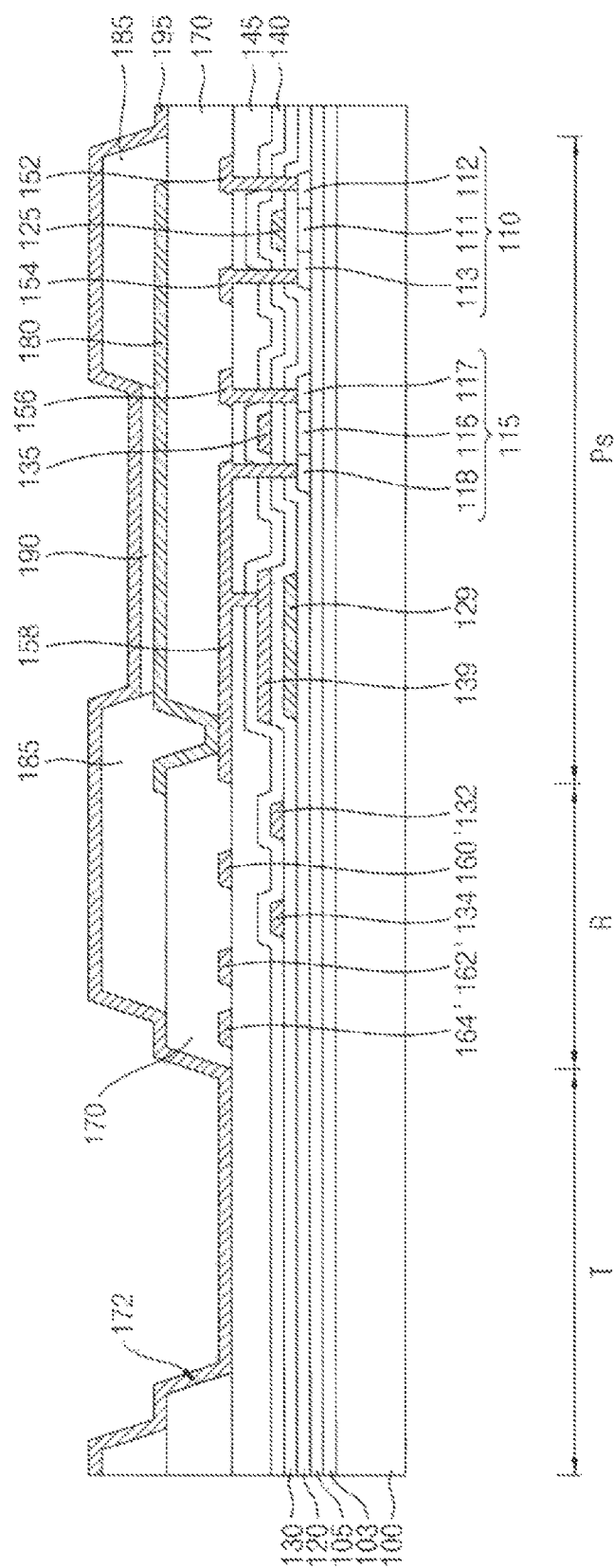
FIG. 5 is a cross-sectional view of an organic light emitting display device in accordance with some exemplary embodiments.

FIG. 5 is a cross-sectional view of an organic light emitting display device in accordance with some exemplary embodiments. An organic light emitting display device in FIG. 5 has a configuration substantially the same as or similar to that of an organic light emitting display device described with reference FIG. 3 except for wirings 132 and 134. In FIG. 5, like or similar reference numerals may indicate like or similar elements illustrated in FIG. 3.

Referring to FIG. 5, an organic light emitting display device according to an exemplary embodiment includes a substrate 100, thin film transistors, capacitors, first wirings, second wirings, a first electrode 180, a light emitting layer 190, and a second electrode 195. The first wirings include first lower wirings 132 and 134 and first upper wirings 160', 162' and 164'. The second wirings are substantially the same as the second wirings described with reference to FIGS. 1 and 2.

As illustrated in FIG. 5, the first lower wirings 132 and 134 are disposed on a first insulating interlayer 130 in a peripheral region R, and the first upper wirings 160', 162' and 164' are positioned on a third insulating interlayer 145 in the peripheral region R. The first lower wirings 132 and 134, a second gate electrode 135 and a second conductive pattern 139 are located at the same level over the substrate 100. Each of the first lower wirings 132 and 134, the second gate electrode 135 and the second conductive pattern 139 may include the same material. The first upper wirings 160', 162' and 164' are positioned at a same level over the substrate 100 as a first source electrode 152, a second source electrode 156, a first drain electrode 154 and a second drain electrode 158. Each of the first upper wirings 160', 162' and 164', the first and the second source electrodes 152 and 156, and the first and the second drain electrodes 154 and 158 may include the same material.

According to exemplary embodiments, when the first upper wirings 160', 162' and 164' are the data wirings described with reference to FIG. 2, the first lower wirings 132 and 134 are the wirings associated with the power supply or the wirings associated with the initialization voltage described with reference to FIG. 2. That is, the first upper wirings 160', 162' and 164' may be the wirings for transferring the data signals to the sub-pixel circuits while the first lower wirings 132 and 134 may be the wirings for supplying power and initialization voltages to the sub-pixel circuits. Alternatively, the first lower wirings 132 and 134 may be the data wirings described with reference to FIG. 2 and the first upper wirings 160', 162' and 164' are the wirings associated with the power supply or the initialization voltage.

In exemplary embodiments, the first upper wirings 160', 162' and 164' do not substantially overlap the first lower wirings 132 and 134, or an area in which the first upper wirings 160', 162' and 164' do overlap the first lower wirings 132 and 134 can be minimized. Accordingly, parasitic capacitances among the first upper wirings 160', 162' and 164' and the first lower wirings 132 and 134 can be prevented or substantially minimized.

Figure 6:
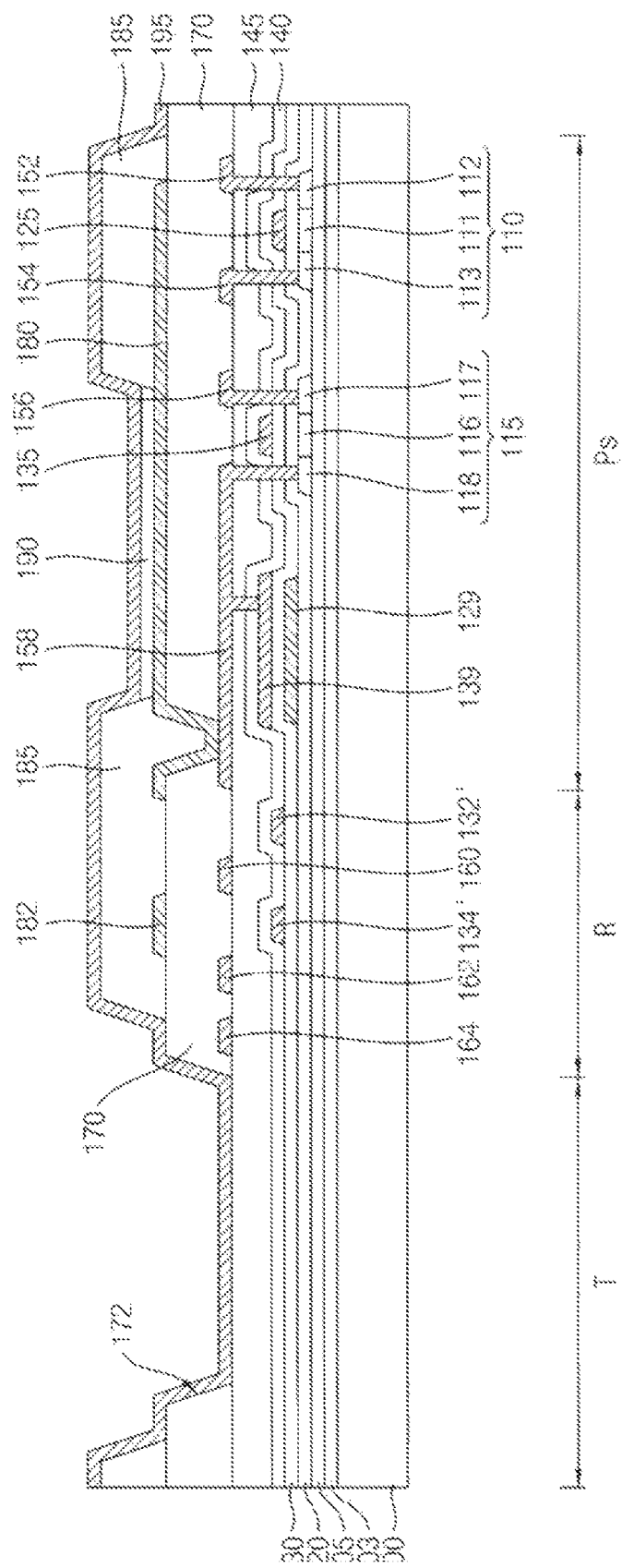
FIG. 6 is a cross-sectional view of an organic light emitting display device in accordance with some exemplary embodiments.

FIG. 6 is a cross-sectional view of an organic light emitting display device in accordance with some exemplary embodiments. An organic light emitting display device in FIG. 6 has a configuration substantially the same as or similar to that of an organic light emitting display device described with reference FIG. 3 except for wirings 132, 134 and 182. In FIG. 6, like or similar reference numerals may indicate like or similar elements illustrated in FIG. 3.

Referring to FIG. 6, an organic light emitting display device according to exemplary embodiments includes a substrate 100, transistors, capacitors, first wirings, second wirings, a first electrode 180, a light emitting layer 190, a second electrode 195. The first wirings include first lower wirings 160, 162 and 164, a first upper wiring 182 and first additional wirings 132' and 134'. In addition, the second wirings are substantially the same as the second wirings described with reference to FIGS. 1 and 2.

In an organic light emitting illustrated in FIG. 6, the first lower wirings 160, 162 and 164 are disposed on a third insulating interlayer 145 in a peripheral region R, and the first upper wiring 182 is disposed on a planarization layer 170 in the peripheral region R. Further, the first additional wirings 132' and 134' are disposed on a first insulating interlayer 130 in the peripheral region R.

According to exemplary embodiments, the first additional wirings 132' and 134' are disposed at a level over the substrate 100 where a second gate electrode 135 and a second conductive pattern 139 are disposed. Each of the first additional wirings 132' and 134', the second gate electrode 135 and the second conductive pattern 139 may include the same material.

According to exemplary embodiments, the first lower wirings 160, 162 and 164 are disposed at level over the substrate 100 where a first source electrode 152, a second source electrode 156, a first drain electrode 154 and a second drain electrode 158 are disposed. Each of the first lower wirings 160, 162 and 164, the first and the second source electrodes 152 and 156, and the first and the second drain electrodes 154 and 158 may include the same material.

According to exemplary embodiments, the first upper wiring 182 is disposed at the same level at which the first electrode 180 is disposed. The first upper wiring 182 may include a material substantially the same as that of the first electrode 180.

In an organic light emitting display device illustrated in FIG. 4, when the first lower wirings 160, 162 and 164 are the data wirings illustrated in FIG. 2, the first additional wirings 132' and 134' are the wirings associated with the power supply and the first upper wiring 182 is the wiring associated with the initialization voltage. For example, wiring 132' may be the first high voltage power supply wiring ELVDD_1 in FIG. 2, and wiring 134' may be the first low voltage power supply wiring ELVSS_1. Here, the first upper wiring 182 is the first initialization voltage wiring VINT_1 illustrated in FIG. 2.

In some exemplary embodiments, the first additional wirings 132' and 134' are the wirings associated with the power supply or the initialization voltage when the first lower wirings 160, 162 and 164 are the data wirings illustrated in FIG. 2. Here, the first upper wiring 182 is the wiring associated with the power supply in FIG. 2. For example, wiring 132' may be the first high voltage power supply wiring ELVDD_1 in FIG. 2, and wiring 134' may be the first initialization voltage wiring VINT_1 on FIG. 2. In this case, the first upper wiring 182 is the first low voltage power supply wiring ELVSS_1 illustrated in FIG. 2.

In other exemplary embodiments, when the first lower wirings 160, 162 and 164 are the wirings associated with the power supply or the initialization voltage, the first additional wirings 132' and 134' and the first upper wiring 182 are the data wirings illustrated in FIG. 2.

According to exemplary embodiments, the first lower wirings 160, 162 and 164, the first additional wirings 132' and 134' and the first upper wiring 182 have a three levels configuration over the substrate 100, such that areas occupied by the first wirings in the peripheral region R can be reduced while increasing an area of a transmissive region T. As a result, an organic light emitting display device according to exemplary embodiments can have improved transmittance.

Figure 7:
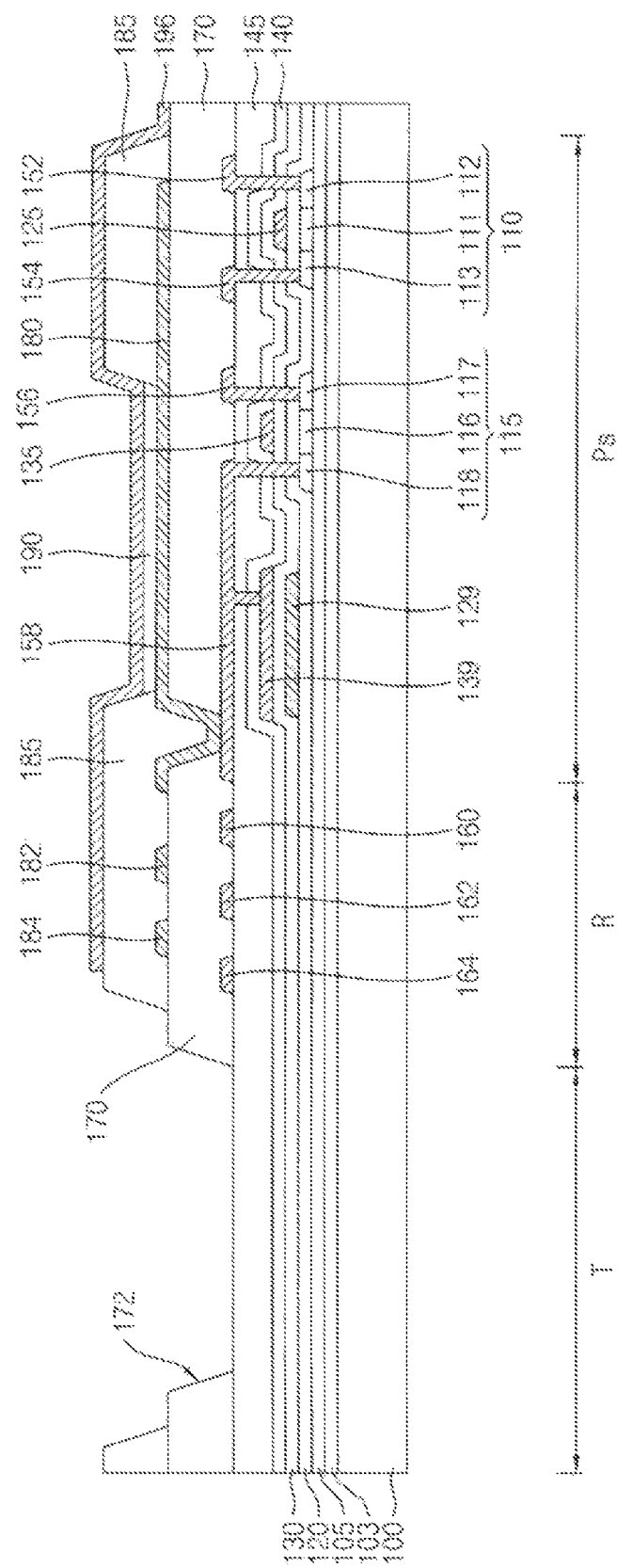
FIG. 7 is a cross-sectional view of an organic light emitting display device in accordance with some exemplary embodiments.

FIG. 7 is a cross-sectional view of an organic light emitting display device in accordance with some exemplary embodiments. An organic light emitting display device in FIG. 7 has a configuration substantially the same as or similar to that of an organic light emitting display device described with reference FIG. 3 except for a second electrode 196. In FIG. 7, like or similar reference numerals may indicate like or similar elements illustrated in FIG. 3.

Referring to FIG. 7, an organic light emitting display device according to exemplary embodiments includes transistors, capacitors, first wirings, second wirings, a first electrode 180, a light emitting layer 190, and the second electrode 196. The first wirings includes first lower wirings 160, 162 and 164, and first upper wirings 182 and 184. The second wirings are substantially the same as the second wirings described with reference to FIGS. 1 and 2.

In an organic light emitting display device in FIG. 7, the second electrode 196 substantially covers a sub-pixel region Ps and a peripheral region R, but not a transmissive region T. For example, the second electrode 196 fully exposes the transmissive region T. Thus, light does not propagate through the second electrode 196 in the transmissive region T, so that the transmissive region T of an organic light emitting display device according to exemplary embodiments can have an increased transmittance.

Figure 8:
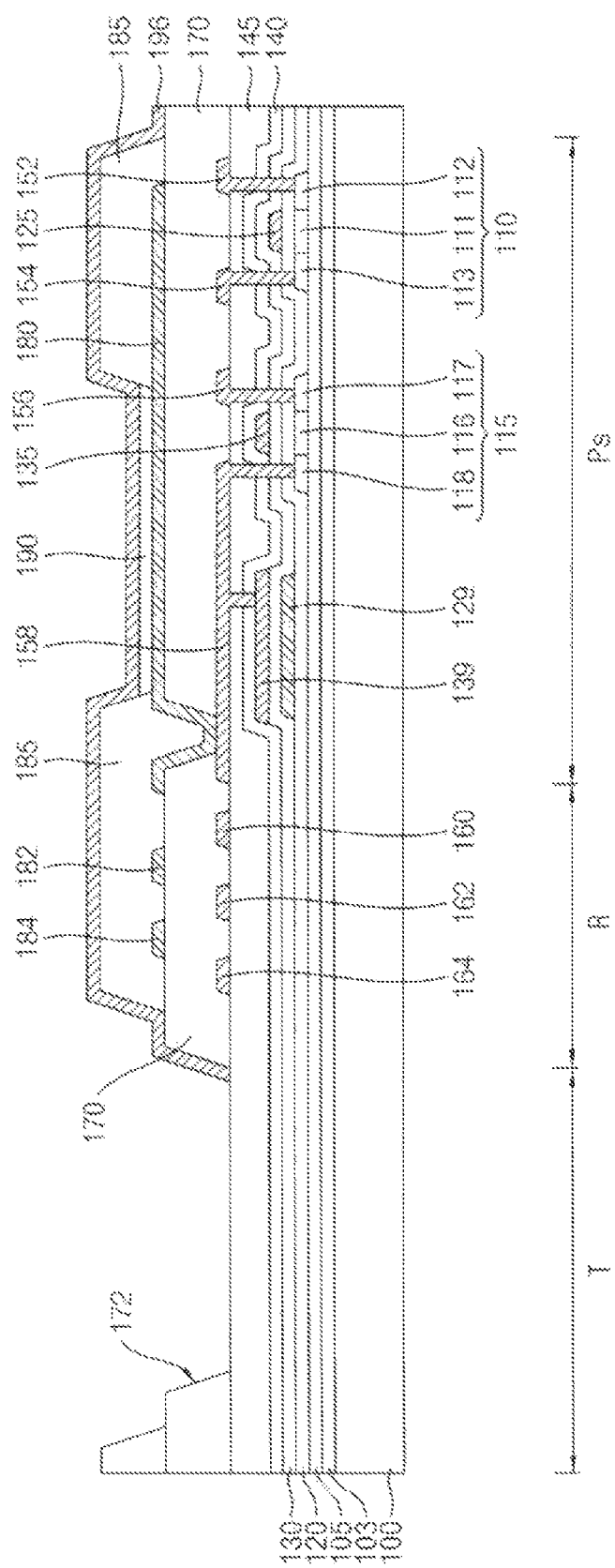
FIG. 8 is a cross-sectional view of an organic light emitting display device in accordance with some exemplary embodiments.

FIG. 8 is a cross-sectional view of an organic light emitting display device in accordance with some exemplary embodiments. An organic light emitting display device in FIG. 8 has a configuration substantially the same as or similar to that of an organic light emitting display device described with reference FIG. 3 except for a second electrode 196. In FIG. 8, like or similar reference numerals may indicate like or similar elements illustrated in FIG. 3.

Referring to FIG. 8, an organic light emitting display device according to exemplary embodiments includes transistors, capacitors, first wirings, second wirings, a first electrode 180, a light emitting layer 190, and the second electrode 196. Here, the first wirings include first lower wirings 160, 162 and 164, and first upper wirings 182 and 184. The second wirings are substantially the same as the second wirings described with reference to FIGS. 1 and 2.

In an organic light emitting display device in FIG. 8, the second electrode 196 extends over a portion of a transmissive region T while substantially covering a sub-pixel region Ps and a peripheral region R. For example, the second electrode 196 extends onto a sidewall of an opening in a pixel defining layer 185, and onto a sidewall of a transmissive window 172 in the transmissive region T. When the second electrode 196 includes a transparent conductive material, an area of the transmissive region T is not substantially reduced even though the second electrode 196 may partially cover the transmissive region T. Hence, an organic light emitting display device according to exemplary embodiments can have an improved transmittance in the transmissive region T.

Figure 9:
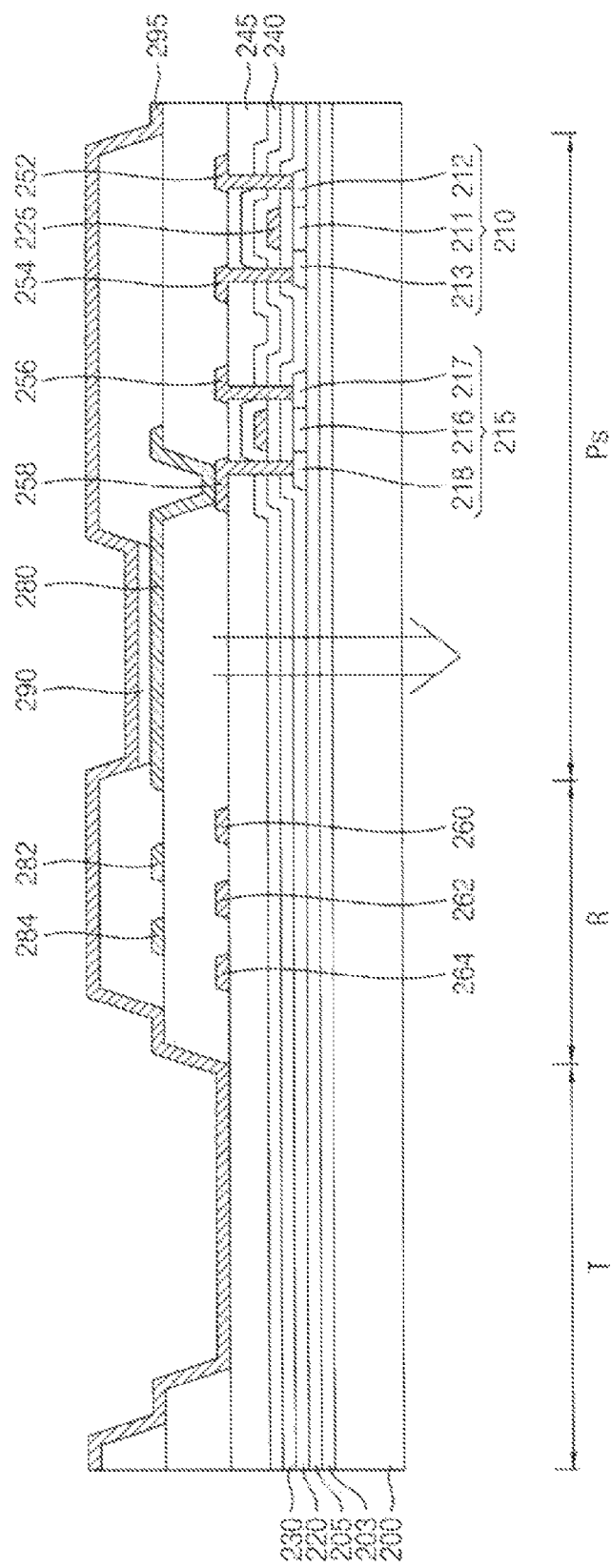
FIG. 9 is a cross-sectional view of an organic light emitting display device in accordance with some exemplary embodiments.

FIG. 9 is a cross-sectional view of an organic light emitting display device in accordance with some exemplary embodiments. An organic light emitting display device in FIG. 9 has a configuration substantially the same as or similar to that of an organic light emitting display device described with reference FIG. 3 except for the arrangement of transistors and capacitors. In FIG. 9, like or similar reference numerals may indicate like or similar elements illustrated in FIG. 3.

Referring to FIG. 9, an organic light emitting display device according to exemplary embodiments includes transistors, capacitors, first wirings, second wirings, a first electrode 280, a light emitting layer 290, and a second electrode 295. In this case, the first wirings include first lower wirings 260, 262 and 264, and first upper wirings 282 and 284. In addition, the second wirings are substantially the same as the second wirings described with reference to FIGS. 1 and 2.

As illustrated in FIG. 9, the light emitting layer 290 does not substantially overlap the transistors and the capacitors at a viewpoint along a direction substantially perpendicular to an upper face of a substrate 200. Therefore, light generated from the light emitting layer 290 may propagate toward the substrate 200 without being blocked by the transistors and the capacitors. In other words, an organic light emitting according to exemplary embodiments may be a bottom emission type, and thus light generated from the light emitting layer 290 may be emitted through the substrate 200 without being blocked by the transistors and the capacitors, as shown by an arrow.

Figure 10:
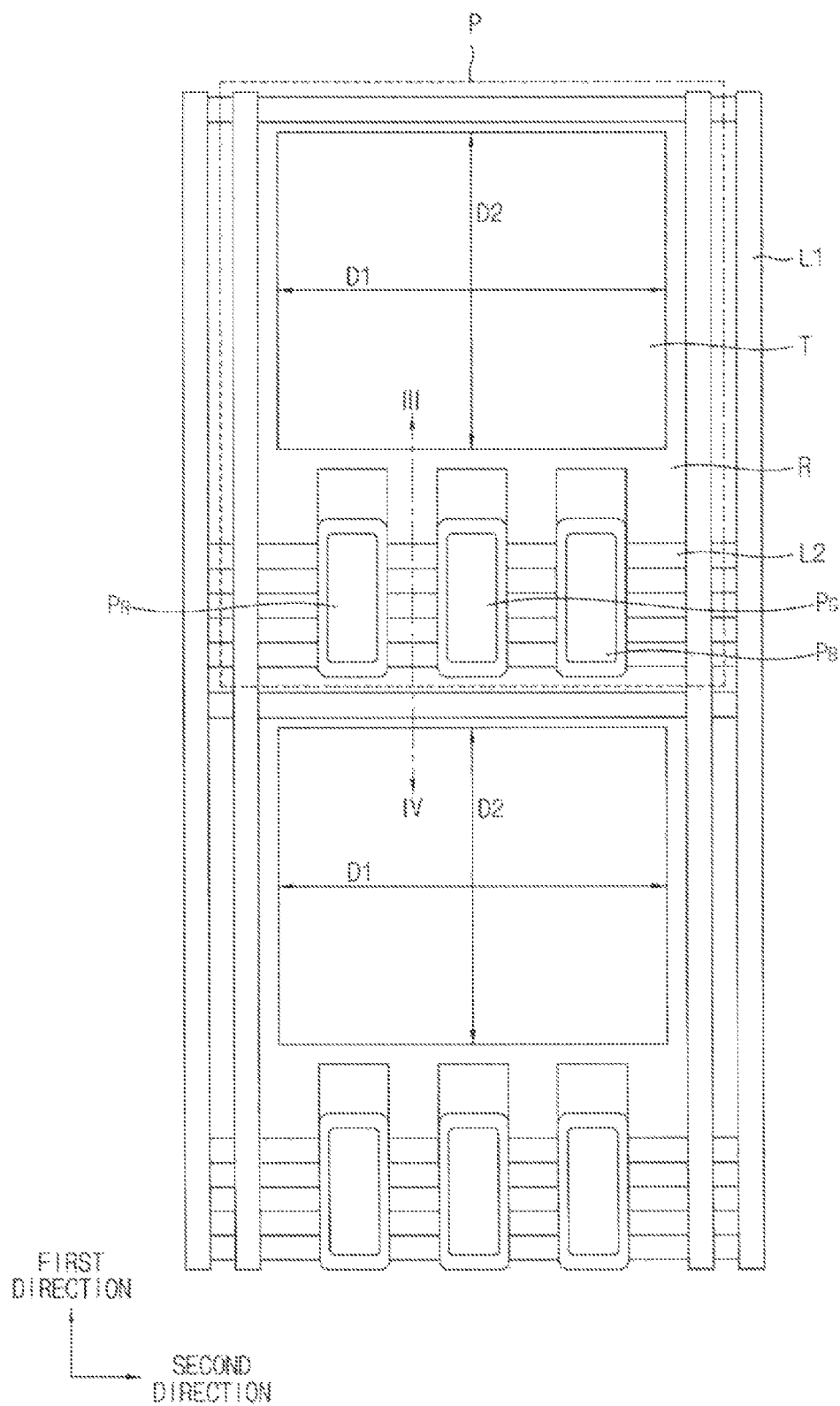
FIG. 10 is a plan view of an organic light emitting display device in accordance with some exemplary embodiments.
Figure 11:
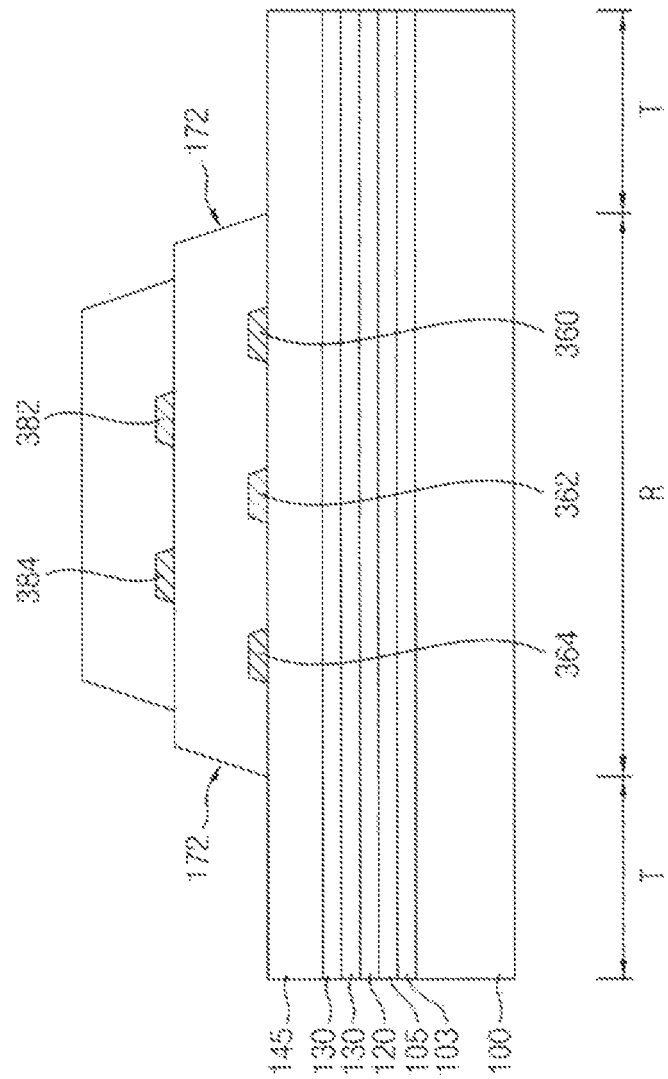
FIG. 11 is a cross-sectional view of an organic light emitting display device in accordance with some exemplary embodiments.

FIG. 10 is a plan view of an organic light emitting display device in accordance with some exemplary embodiments. FIG. 11 is a cross-sectional view of an organic light emitting display device in accordance with some exemplary embodiments. FIG. 11 illustrates a cross section of an organic light emitting display device taken along a line of III-IV in FIG. 10. In FIGS. 10 and 11, like or similar reference numerals may indicate like or similar elements illustrated in FIGS. 1 and 3.

Referring to FIGS. 10 and 11, an organic light emitting display device according to exemplary embodiments includes a substrate 100, transistors, capacitors, first wirings L1, second wirings L2, a first electrode, a light emitting layer, an second electrode. In this case, the first wirings L1 are substantially the same as the first wirings described with reference to FIGS. 1 and 2. The second wirings L2 include second lower wirings 360, 362 and 364, and second upper wirings 382 and 384.

In exemplary embodiments, an organic light emitting display device includes a plurality of pixels P arranged on the substrate 100 along a first direction and a second direction. Each pixel P has a first sub-pixel $P_R$, a second sub-pixel $P_G$, a third sub-pixel $P_B$, a transmissive region T, and a peripheral region R. The first sub-pixel $P_R$, the second sub-pixel $P_G$ and the third sub-pixel $P_B$ respectively generate red light, green light and blue light. In addition, each of the first sub-pixel $P_R$, the second sub-pixel $P_G$ and the third sub-pixel $P_B$ may have various shapes, such as a substantially rectangular shape, a substantially elliptical shape, a substantially hyperelliptical shape, etc.

As described above, in an exemplary embodiment, the transmissive region T is spaced apart from the first sub-pixel $P_R$, the second sub-pixel $P_G$ and the third sub-pixel $P_B$ along the first direction. The transmissive region T has a first length D1 in the first direction and a second length D2 in the second direction. For example, when the transmissive region T has a substantially rectangular shape, the transmissive region T has an area defined by the product of the first length D1 and the second length D2. As the area of the transmissive region T increases, the transmittance of the organic light emitting display device increases. The peripheral region R substantially surrounds the transmissive region T and the first to the third sub-pixels $P_R$, $P_G$ and $P_B$. For example, the peripheral region R may correspond to a remaining region of each pixel P, except for the first to the third sub-pixels $P_R$, $P_G$ and $P_B$ and the transmissive region T.

An organic light emitting display device according to an exemplary embodiment includes the first wirings L1 and the second wirings L2, which are electrically connected to circuits in the pixels P. In exemplary embodiments, light emitting structures and sub-pixel circuits for controlling the light emitting structures are provided in the first to the third sub-pixels $P_R$, $P_G$ and $P_B$. The first and the second wirings L1 and L2 are electrically connected to the sub-pixel circuits.

As illustrated in FIG. 10, the first wirings L1 extend in the first direction and the second wirings L2 extend along the second direction substantially perpendicular to the first direction. The second wirings L2 are disposed between adjacent pixels P along the first direction. The second wirings L2 substantially overlap the first wirings and the first to the third sub-pixels $P_R$, $P_G$ and $P_B$ but do not substantially overlap the transmissive region T. Although FIG. 10 illustrates the second wirings L2 as partially overlapping the first to the third sub-pixels $P_R$, $P_G$ and $P_B$, embodiments of the disclosure are not limited this configuration. For example, the second wirings L2 can be disposed between the transmissive region T and the first to the third sub-pixels $P_R$, $P_G$ and $P_B$.

As illustrated in FIG. 10, a distance between the transmissive regions T of adjacent pixels P in the first direction can be determined by dimensions of the second wirings L2 positioned between adjacent transmissive regions T. When a total area of the second wirings L2 increases, the distance between adjacent transmissive regions T may increase, and thus the second length D2 of the transmissive region T may decrease. On the other hand, the second length D2 of the transmissive region T may increase as the distance between adjacent transmissive regions T decreases, and thus the area of the transmissive region T can increase.

In exemplary embodiments, the second wirings L2 have a multi level configuration on the substrate 100. Here, the distance between the transmissive regions T in the first direction is substantially smaller than a sum of respective wirings included in the second wirings L2. In other words, when the second wirings L2 are disposed in a multi level configuration, the distance between the transmissive regions T in the first direction may be substantially decreased in comparison with that of the second wirings L2 arranged in a single level configuration. As a result, the area of the transmissive region T can increase, thereby improving the transmittance of the organic light emitting display device.

Referring to FIG. 11, the second lower wirings 360, 362 and 364 are disposed on a third insulating interlayer 145 in the peripheral region R. The second lower wirings 360, 362 and 364 are positioned at a same level as that of a first source electrode 152, a second source electrode 156, a first drain electrode 154 and a second drain electrode 158. In addition, the second lower wirings 360, 362 and 364 may include materials substantially the same as those of the first and the second source electrodes 152 and 156, and the first and the second drain electrodes 154 and 158. For example, each of the second lower wirings 360, 362 and 364 may include copper, aluminum, platinum, silver, gold, magnesium, chrome, tungsten, molybdenum, titanium, alloy thereof, etc.

In an organic light emitting display device illustrated in FIG. 11, three second lower wirings 360, 362 and 364 are disposed on the third insulating interlayer 145 in the peripheral region R, however, embodiments of the disclosure are not limited to such a configuration. For example, more or fewer than three second lower wirings 360, 362 and 364 may be disposed on the third insulating interlayer 145 in the peripheral region R.

In exemplary embodiments, the second upper wirings 382 and 384 are disposed on a planarization layer 172. In exemplary embodiments, the second upper wirings 382 and 384 and the first electrode 180 are disposed at the same level over the substrate 100. Therefore, the second upper wirings 382 and 384 are positioned at a same level as that of the first upper wirings 182 and 184 illustrated in FIG. 3. Further, each of the second upper wirings 382 and 384 and the first electrode 180 may include the same material. For example, each of the second upper wirings 382 and 384 may include metal, alloy, metal nitride, conductive metal oxide, transparent conductive material, etc.

In an organic light emitting display device illustrated in FIG. 11, the second lower wirings 360, 362 and 364 are associated with the power supply described with reference to FIG. 2, and the second upper wirings 382 and 384 transmit the signals illustrated in FIG. 2. For example, the second lower wirings 360, 362 and 364 may be the second low voltage power supply wiring ELVSS_2, the second high voltage power supply wiring ELVDD_2 and the second initialization voltage wiring VINT_2, respectively, illustrated in FIG. 2. In addition, the second upper wirings 382 and 384 may be the wirings for the light emitting signals, the wiring for the scan signals and the wiring for the gate initialization described with reference to FIG. 2. Alternatively, the second lower wirings 360, 362 and 364 may be the signal wirings in FIG. 2 and the second upper wirings 382 and 384 may be the wirings associated with the power supply or the wirings associated with the initialization voltage illustrated in FIG. 2.

Although FIG. 11 shows two second upper wirings 382 and 384 disposed on the planarization layer 170 in the peripheral region R, embodiments of the disclosure are not limited to this configuration. For example, more or fewer than two second upper wirings 382 and 384 may be disposed on the planarization layer 170 in the peripheral region R.

As described above, the second lower wirings 360, 362 and 364, the first and the second source electrodes 152 and 156, the first and the second drain electrodes 154 and 158, and the first lower wirings 160, 162 and 164 (see FIG. 3) are disposed at the same level over the substrate 100. Further, the second upper wirings 382 and 384, the first electrode 180 and the first upper wirings 182 and 184 (see FIG. 3 are disposed at the same level over the substrate 100. In addition to the first lower wirings 160, 162 and 164 and the first upper wirings 182 and 184 having a double level configuration, the second lower wirings 360, 362 and 364 and the second upper wirings 382 and 384 may be alternatively or additionally have a double level configuration. Therefore, the area occupied by the first wirings L1 and/or the second wirings L2 can be reduced in the peripheral region R whereas the length of the transmissive region T can be increased. As a result, an organic light emitting display device according to exemplary embodiments can improve transmittance by increasing the area of the transmissive region T.

FIGS. 12 to 18 are cross-sectional views that illustrate a method of manufacturing an organic light emitting display device in accordance with exemplary embodiments. FIGS. 12 to 18 are cross-sectional views taken along a line of I-II in FIG. 1. In FIGS. 12 to 18, like or similar reference numerals may indicate like or similar elements illustrated in FIG. 3.

Figure 12:
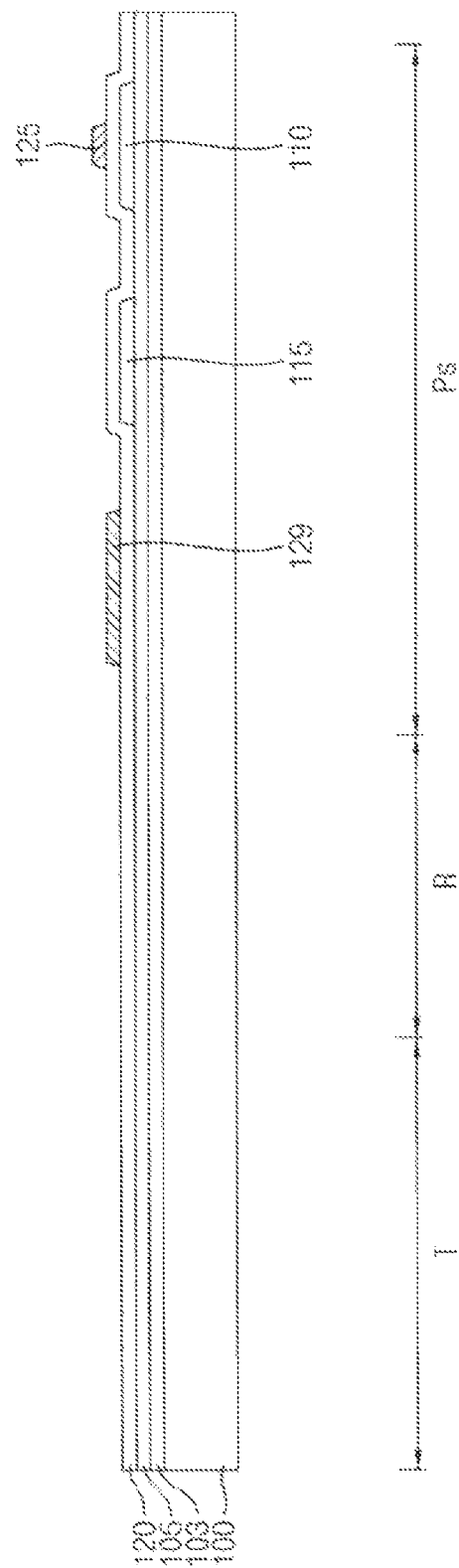
FIGS. 12 to 18 are cross-sectionals view that illustrate a method of manufacturing an organic light emitting display device in accordance with exemplary embodiments.

Referring to FIG. 12, a first barrier layer 103 and a second barrier layer 105 are formed on a substrate 100. The substrate 100 may be formed using a transparent insulation substrate. For example, the substrate 100 may be formed using a glass substrate, a quartz substrate, a transparent plastic substrate, a flexible substrate, etc. In exemplary embodiments, the substrate 100 includes, as illustrated in FIGS. 1 and 10, a plurality of pixels P in which each pixel P includes a sub-pixel region Ps, a transmissive region T and a peripheral region R.

The first and the second barrier layers 103 and 105 can prevent moisture and/or oxygen from diffusing into the organic light emitting display device, and can also block ions from diffusing from the substrate 100. Furthermore, the first and the second barrier layers 103 and 105 can substantially planarize an upper face of the substrate 100. In addition, each of the first and the second barrier layers 103 and 105 may be formed from an inorganic material such as silicon oxide, silicon nitride, silicon oxynitride, aluminum oxide, aluminum nitride, titanium oxide, titanium nitride, etc. Alternatively, each of the first and the second barrier layers 103 and 105 may be formed from an organic material, such as polyimide, polyester, acryl, etc. Alternatively, in some exemplary embodiments, the first barrier layer 103 and/or the second barrier layer 105 are not formed on the substrate 100, depending on components, surface conditions and processing conditions of the substrate 100.

In exemplary embodiments, a first active pattern 110 and a second active pattern 115 are formed on the second barrier layer 105 or the substrate 100. Each of the first and the second active patterns 110 and 115 can be formed from single crystalline silicon, polycrystalline silicon, oxide semiconductor, etc.

In exemplary embodiments, a gate insulation layer 120 is formed on the second barrier layer 105 or the substrate 100 to substantially cover the first and the second active patterns 110 and 115. In addition, the gate insulation layer 120 may be formed using silicon oxide, metal oxide, etc. If the gate insulation layer 120 includes silicon oxide, interfaces between the first active pattern 110 and the gate insulation layer 120 and between the second active pattern 115 and the gate insulation layer 120 can be more stable.

In exemplary embodiments, a first gate electrode 125 and a first conductive pattern 129 are formed on the gate insulation layer 120. For example, a first conductive layer is formed on the gate insulation layer 120, and then the first conductive layer is patterned to simultaneously form the first gate electrode 125 and the first conductive pattern 129 in the sub-pixel region Ps. In exemplary embodiments, the first gate electrode 125 is formed over the first active pattern 110, and the first conductive pattern 129 is spaced apart from the second active pattern 115 by a predetermined distance.

Figure 13:
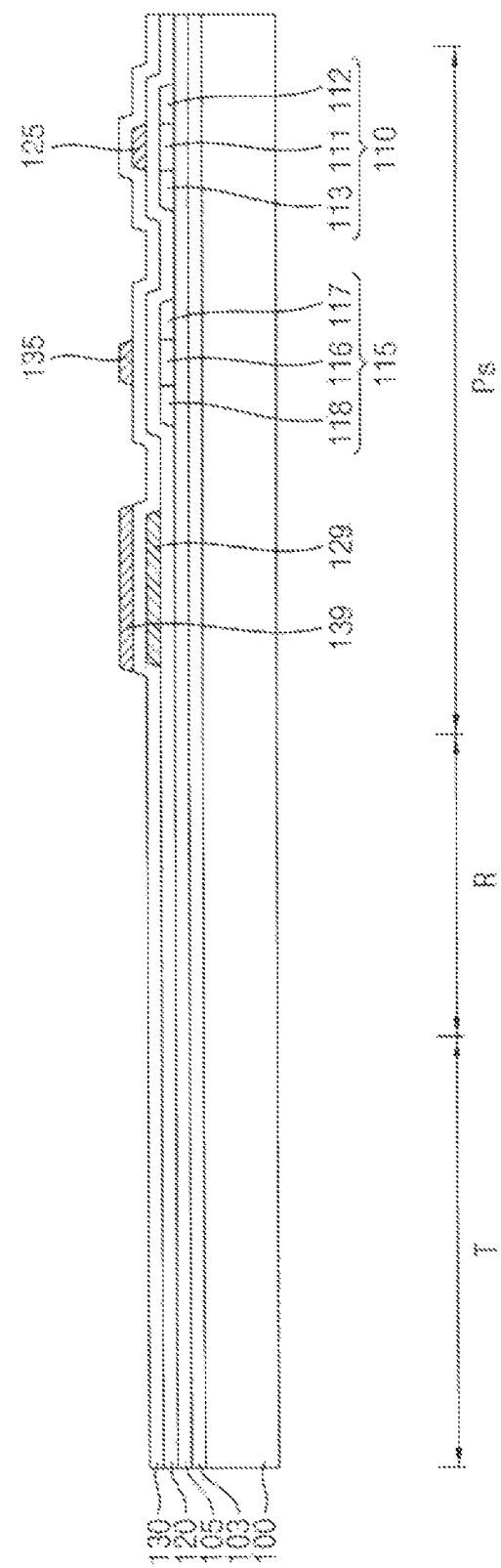

Referring to FIG. 13, in exemplary embodiments, a first insulating interlayer 130 is formed on the gate insulation layer 120 to substantially cover the first gate electrode 125 and the first conductive pattern 129. For example, the first insulating interlayer 130 may be formed by a chemical vapor deposition (CVD) process, a plasma enhanced chemical vapor deposition (PECVD) process, a low pressure chemical vapor deposition (LPCVD) process or an atomic layer deposition (ALD) process using a silicon compound such as silicon nitride or silicon oxynitride.

In exemplary embodiments, a second gate electrode 135 and a second conductive pattern 139 are formed on the first insulating interlayer 130. For example, after a second conductive layer is formed on the first insulating interlayer 130, the second conductive layer is patterned to simultaneously form the second gate electrode 135 and the second conductive pattern 139 in the sub-pixel region Ps. The second conductive layer may be formed using a metal, a metal nitride, an alloy, a conductive metal oxide, a transparent conductive material, etc. In exemplary embodiments, the second gate electrode 135 is formed over the second active pattern 115, and the second conductive pattern 139 is formed over the first conductive pattern 129. Thus, a capacitor that includes the first conductive pattern 129, a portion of the first insulating interlayer 130 and the second conductive pattern 139 is formed in the sub-pixel region Ps.

In exemplary embodiments, impurities can be implanted into the first and the second active patterns 110 and 115 using the first and the second gate electrodes 125 and 135 as ion implantation masks. Hence, a first source region 112, a first drain region 113 and a first channel region 111 are formed from the first active pattern 110. Similarly, a second source region 117, a second drain region 118 and a second channel region 116 are formed from the second active pattern 115.

Figure 14:
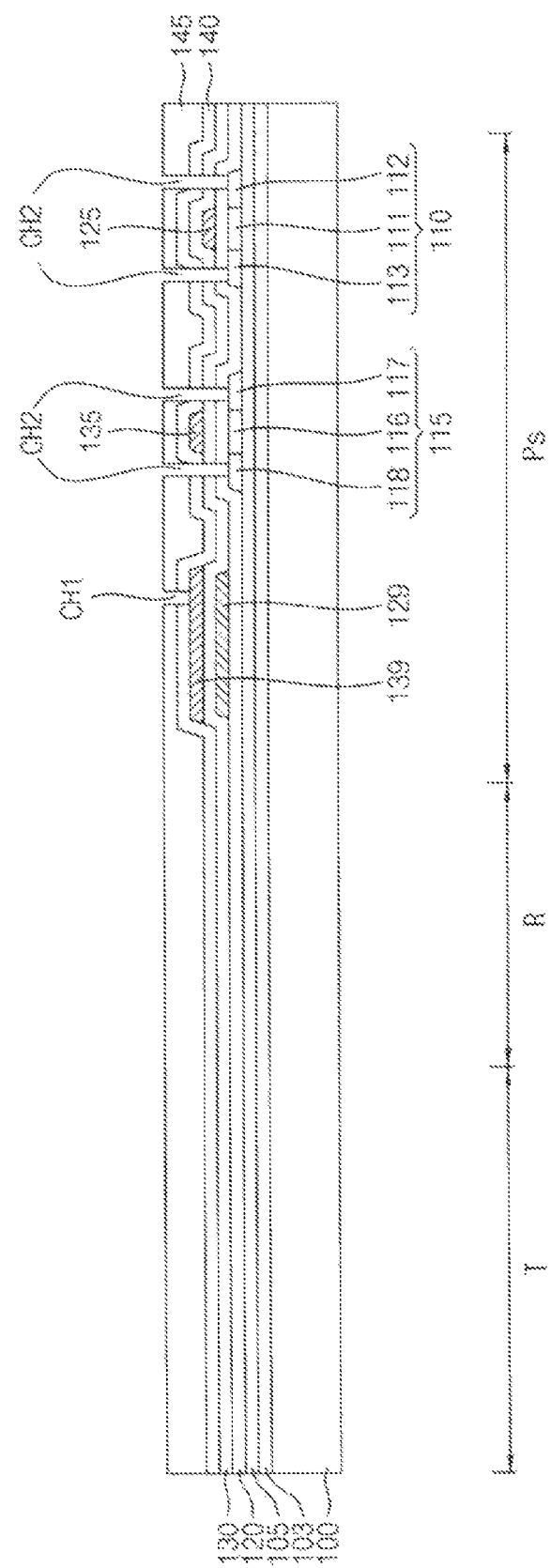

Referring to FIG. 14, in exemplary embodiments, a second insulating interlayer 140 is formed on the first insulating interlayer 130 to substantially cover the second gate electrode 135 and the second conductive pattern 139. The second insulating interlayer 140 may be formed by a chemical vapor deposition process, a plasma enhanced chemical vapor deposition process, a low pressure chemical vapor deposition process or an atomic layer deposition process using silicon oxide.

In exemplary embodiments, a third insulating interlayer 145 is formed on the second insulating interlayer 140. The third insulating interlayer 145 has a substantially flat upper face. In addition, the third insulating interlayer 145 may be formed by a chemical vapor deposition process, a plasma enhanced chemical vapor deposition process, a low pressure chemical vapor deposition process or an atomic layer deposition process using a silicon compound such as silicon nitride or silicon oxynitride.

In exemplary embodiments, the third insulating interlayer 145 and the second insulating interlayer 140 are partially removed to form a first contact hole CH1 that exposes the second conductive pattern 139. In addition, second contact holes CH2 exposing the first and the second source regions 112 and 117 and the first and the second drain regions 113 and 118 are formed by partially etching the third insulating interlayer 145, the second insulating interlayer 140, the first insulating interlayer 130 and the gate insulation layer 120. In exemplary embodiments, the first contact hole and the second contact holes are simultaneously formed.

Figure 15:
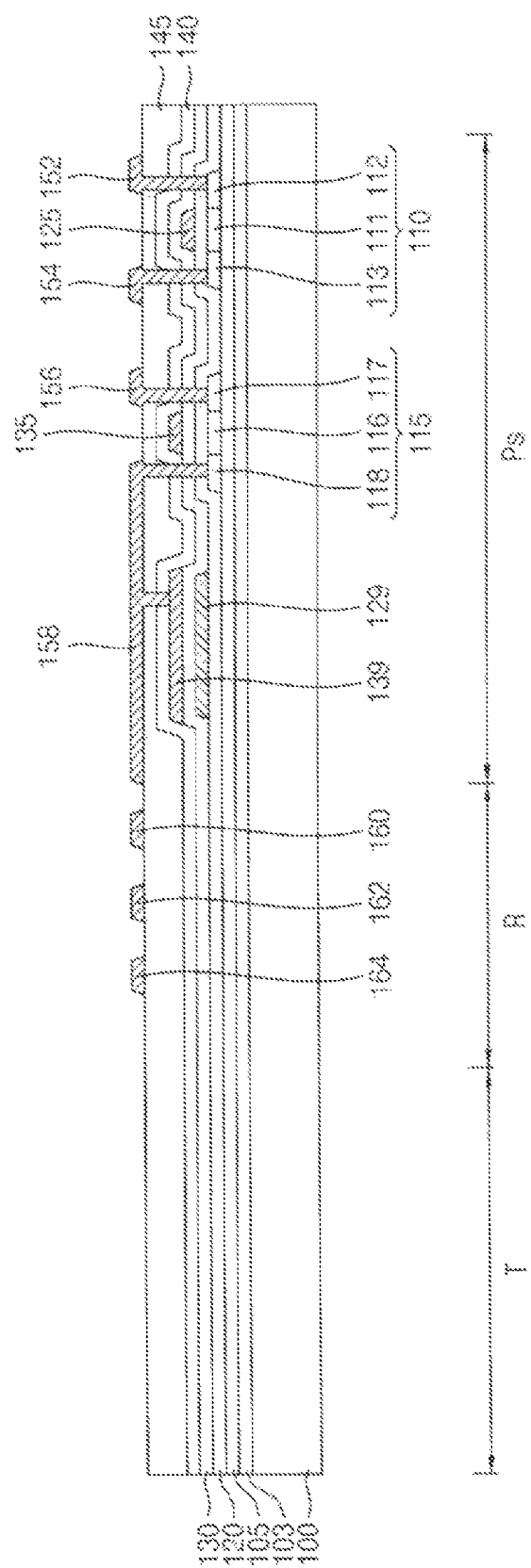

Referring to FIG. 15, in exemplary embodiments, a first source electrode 152, a first drain electrode 154, a second source electrode 156, a second drain electrode 158 and first lower wirings 160, 162 and 164 are formed on the third insulating interlayer 145. In exemplary embodiments, a third conductive layer is formed on the third insulating interlayer 145, and then the third conductive layer is patterned to form the first and the second source electrodes 152 and 156 and the first and the second drain electrodes 154 and 158 in the sub-pixel region Ps while forming the first lower wirings 160, 162 and 164 in the peripheral region R. Here, the first lower wirings 160, 162 and 164, the first and the second source electrodes 152 and 156, and the first and the second drain electrodes 154 and 158 are simultaneously formed. The first source and drain electrodes 152 and 154 penetrate through the third to the first insulating interlayers 145, 140 and 130 and the gate insulation layer 120 to make contact with the first source and drain regions 112 and 113 of the first active pattern 110, respectively. Further, the second source and drain electrodes 156 and 155 also penetrate through the third to the first insulating interlayers 145, 140 and 130 and the gate insulation layer 120 to make contact with the second source and drain regions 117 and 118 of the second active pattern 115, respectively. Therefore, a first transistor and a second transistor are formed in the sub-pixel region Ps. The second electrode 158 of the second transistor extends onto the third insulating interlayer 145, and substantially fills the first contact hole. Thus, the second drain electrode 158 contacts the second conductive pattern 139 of the capacitor. As a result, the second transistor can be electrically connected to the capacitor. The first lower wirings 160, 162 and 164 in the peripheral region R are simultaneously formed together with the first and the second source electrodes 152 and 156 and the first and the second drain electrodes 154 and 158, so that no additional process for forming the first lower wirings 160, 162 and 164 is required.

Figure 16:
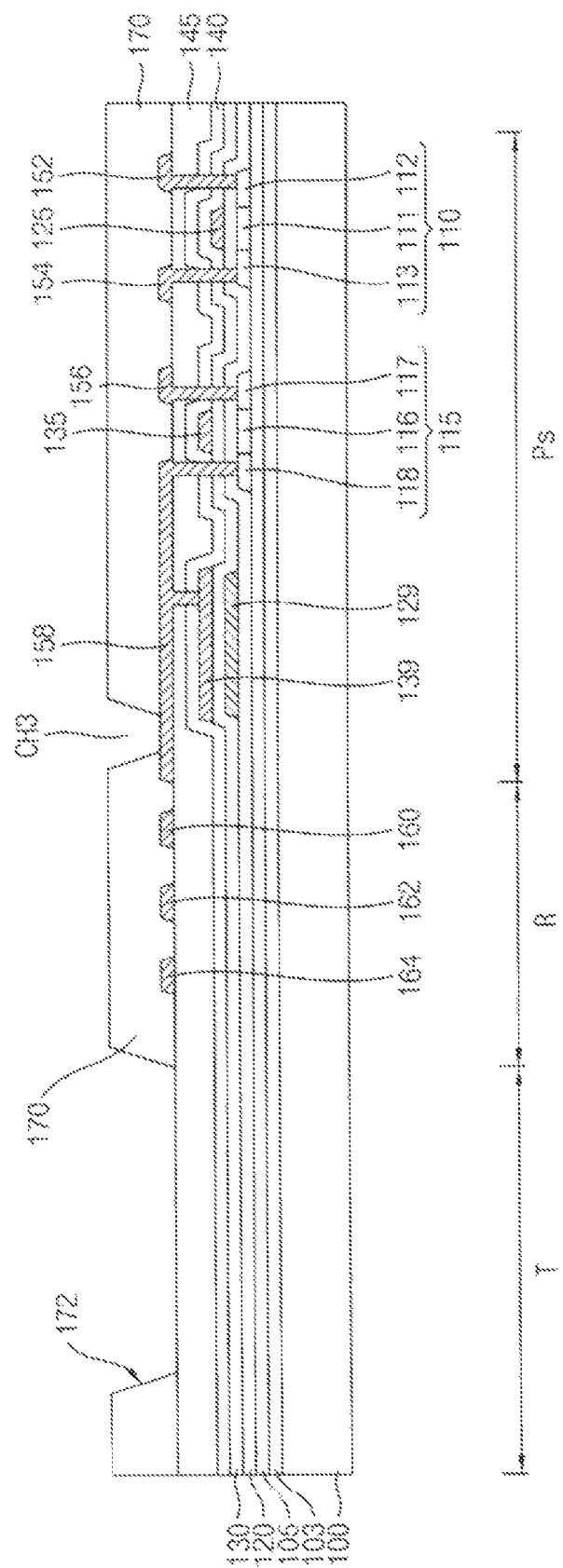

Referring to FIG. 16, in exemplary embodiments, a planarization layer 170 is formed on the third insulating interlayer 145 to substantially cover the first lower wirings 160, 162 and 164, the first and the second source electrodes 152 and 156 and the first, and the second drain electrodes 154 and 158. For example, the planarization layer 170 may be formed on the third insulating interlayer 145 by a coating process such as a spin coating process using an organic material such as polyimide, polyester, acryl, etc. The planarization layer 170 has a substantially flat upper face for elements subsequently formed thereon.

In exemplary embodiments, the planarization layer 170 is partially removed to form a transmissive window 172 exposing the third insulating interlayer 145, and to form a third contact hole CH3 exposing the second drain electrode 158. The transmissive window 172 and the third contact hole are formed in the transmissive region T and the sub-pixel region Ps, respectively.

Figure 17:
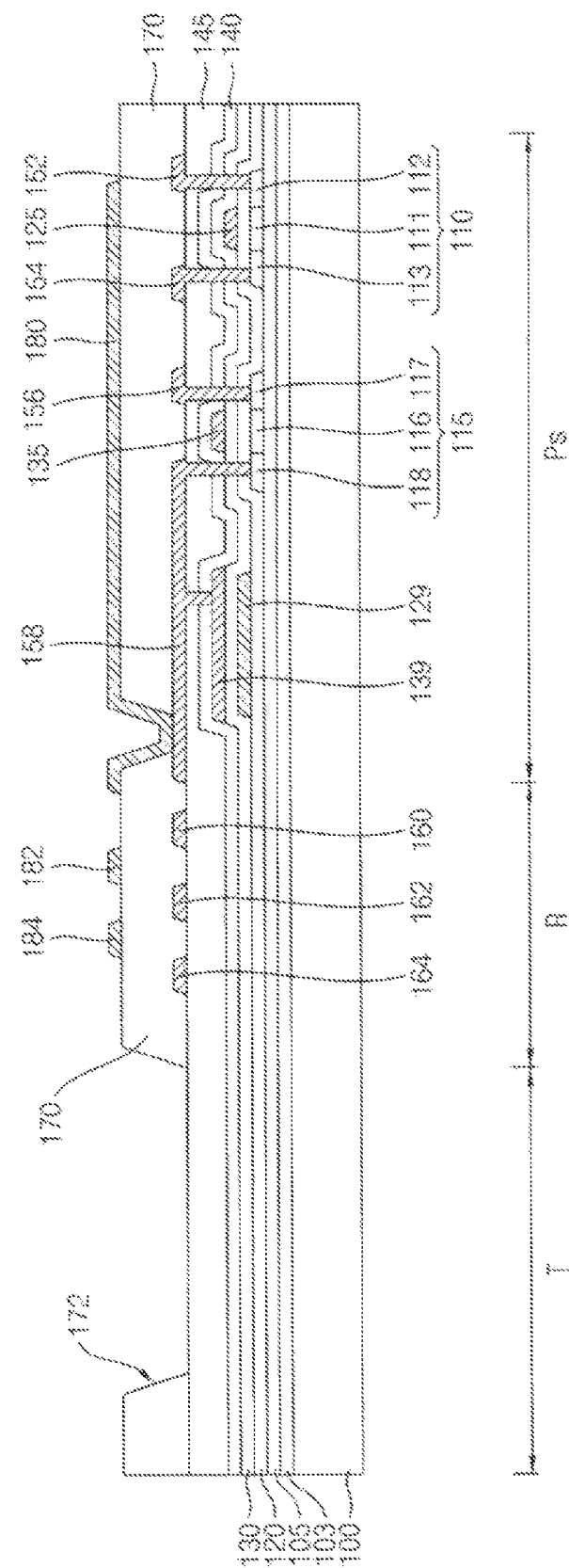

Referring to FIG. 17, in exemplary embodiments, a first electrode 180 and first upper wirings 182 and 184 are formed on the planarization layer 170. According to exemplary embodiments, a fourth conductive layer is formed on the planarization layer 170 and a sidewall of the third contact hole, and then the fourth conductive layer is patterned to simultaneously form the first electrode 180 and the first upper wirings 182 and 184. For example, the fourth conductive layer may be formed using a transparent conductive material, a conductive metal oxide, etc.

In exemplary embodiments, the first upper wirings 182 and 184 are formed over the first lower wirings 160, 162 and 164 in the peripheral region R. The first electrode 180 extends onto the planarization layer 170 in the sub-pixel region Ps while contacting the second drain electrode 158. The first upper wirings 182, 184 and the first electrode 180 are simultaneously formed, so that no additional process for forming the first upper wirings 182 and 184 is needed.

In exemplary embodiments, the first upper wirings 182 and 184 and the first lower wirings 160, 162 and 164 are formed in a double level configuration, to reduce the area occupied by the first upper wirings 182 and 184 and the first lower wirings 160, 162 and 164 in the peripheral region R. Therefore, the transmissive region T can have an increased area thereby improving transmittance of an organic light emitting display device.

Figure 18:
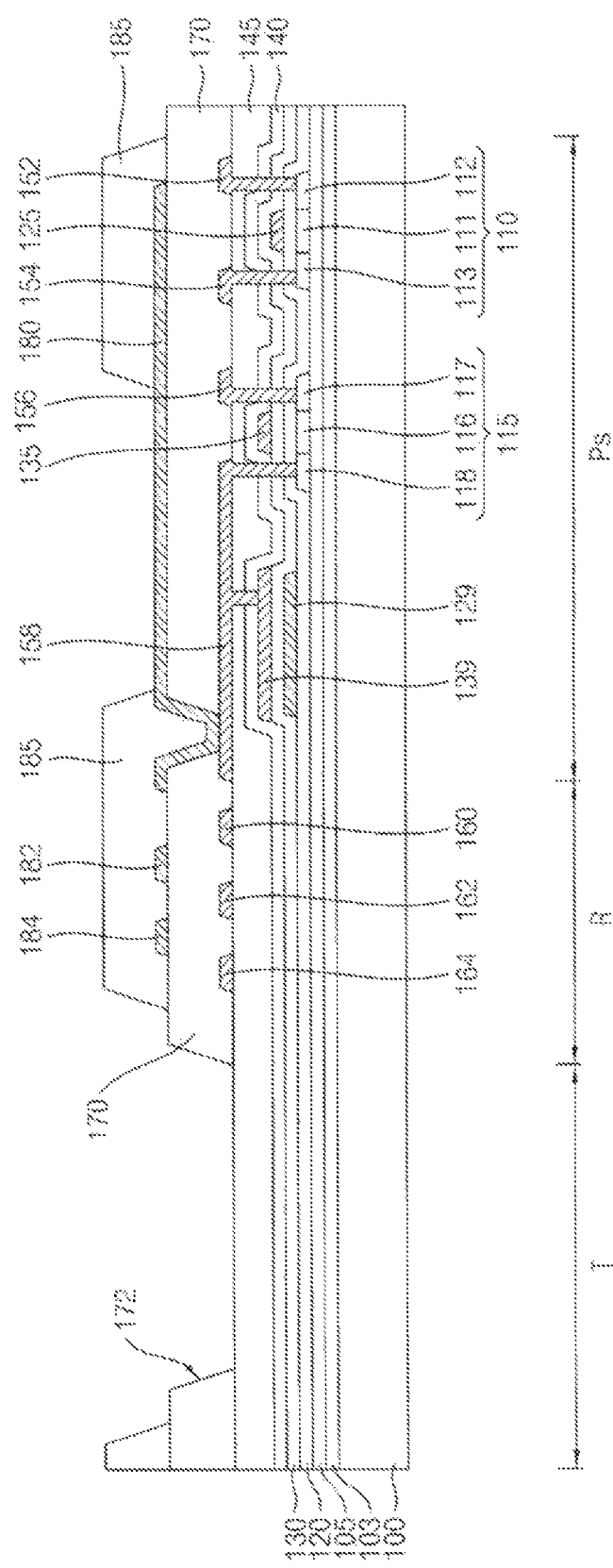

Referring to FIG. 18, in exemplary embodiments, a pixel defining layer 185 is formed on the planarization layer 170. The pixel defining layer 185 is formed from an organic material such as polyimide. The pixel defining layer 185 is partially etched to form an opening that exposes the transmissive window 172 in the transmissive region T, and to form a pixel opening that exposes the first electrode 180 in the sub-pixel region Ps. Hence, there is no pixel defining layer 185 remaining on a bottom and a sidewall of the transmissive window 172.

In exemplary embodiments, in the sub-pixel region Ps, a light emitting layer and a second electrode are sequentially formed on the exposed first electrode 180. Therefore, an organic light emitting display device having a configuration substantially the same as or similar to that of an organic light emitting display device described with reference to FIG. 3 is provided.

FIGS. 19 to 22 are cross-sectionals view that illustrate a method of manufacturing an organic light emitting display device in accordance with some exemplary embodiments.

In FIGS. 19 to 22, like or similar reference numerals may indicate elements like or similar to those illustrated in FIG. 3 or FIG. 6.

Figure 19:
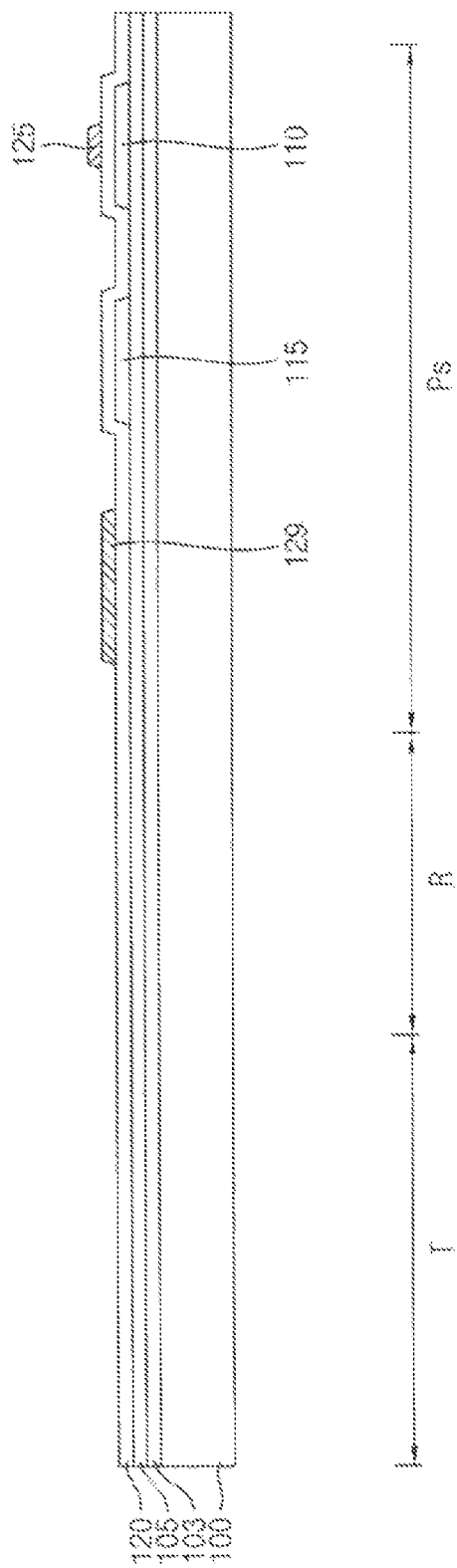
FIGS. 19 to 22 are cross-sectionals view that illustrate a method of manufacturing an organic light emitting display device in accordance with some exemplary embodiments.

Referring to FIG. 19, in exemplary embodiments, after forming a first barrier layer 103 and a second barrier layer 105 on a substrate 100, a first active pattern 110 and a second active pattern 115 are formed on the second barrier layer 105.

In exemplary embodiments, a gate insulation layer 120 is formed on the second barrier layer 105 to substantially cover the first and the second active patterns 110 and 115 in a sub-pixel region Ps. A first gate electrode 125 and a first conductive pattern 129 are formed on the gate insulation layer 120. The first conductive pattern 129 is spaced apart from the second active pattern 115 by a predetermined distance, and the first gate electrode 125 is formed over the first active pattern 110.

Figure 20:
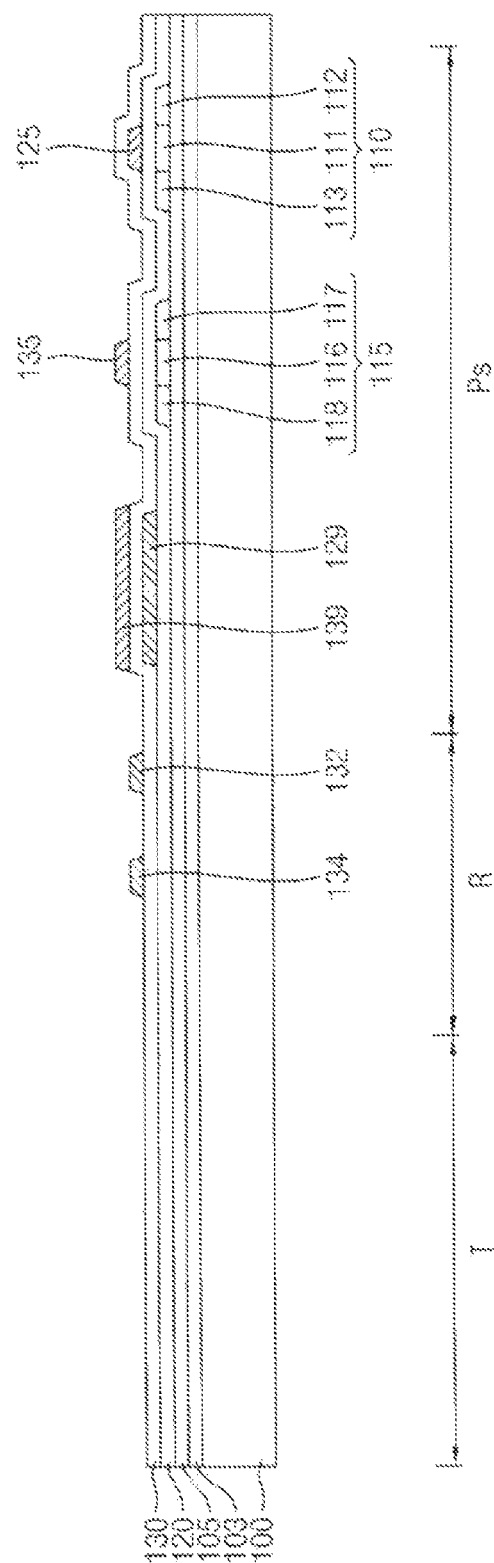

Referring to FIG. 20, in exemplary embodiments, a first insulating interlayer 130 is formed on the gate insulation layer 120 to substantially cover the first gate electrode 125 and the first conductive pattern 129. For example, the first insulating interlayer 130 may be formed using silicon nitride, silicon oxynitride, etc. A second gate electrode 135, a second conductive pattern 139 and first lower wirings 132 and 134 are formed on the first insulating interlayer 130.

In exemplary embodiments, in the sub-pixel region Ps, the second gate electrode 135 is formed over the second active pattern 115. The second conductive pattern 139 is formed over the first conductive pattern 129, to form a capacitor that includes the first conductive pattern 129, a portion of the first insulating interlayer 130 and the second conductive pattern 139. In a peripheral region R, the first lower wirings 132 and 134 are separated by a predetermined distance on the first insulating interlayer 130. In exemplary embodiments, the second gate electrode 135, the second conductive pattern 139 and the first lower wirings 132 and 134 are simultaneously formed.

Figure 21:
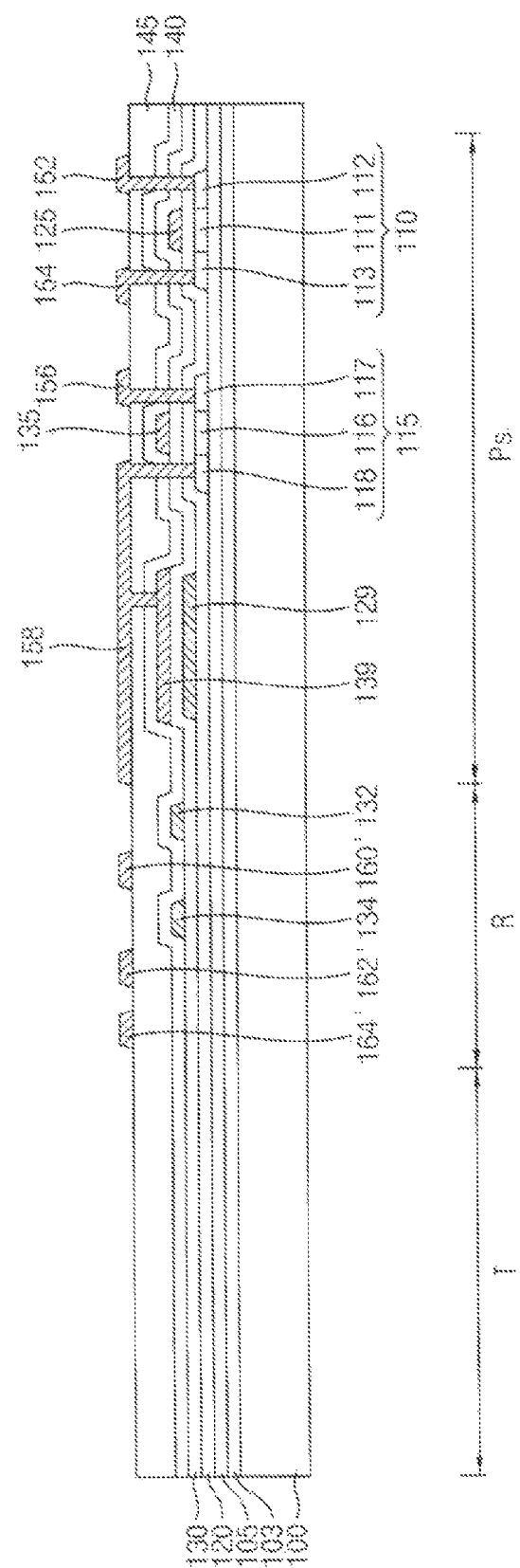

Referring to FIG. 21, In exemplary embodiments, a second insulating interlayer 140 and a third insulating interlayer 145 are sequentially formed on the first insulating interlayer 130 to substantially cover the second gate electrode 135 and the second conductive pattern 139. The third insulating interlayer 145 has a substantially flat upper face.

In exemplary embodiments, a first source electrode 152, a first drain electrode 154, a second source electrode 156, a second drain electrode 158, and first upper wirings 160', 162' and 164' are formed on the third insulating interlayer 145. The first source and drain electrodes 152 and 154, the second source and drain electrodes 156 and 158, and first upper wirings 160', 162' and 164' are formed simultaneously. In exemplary embodiments, the third and the second insulating interlayers 145 and 140 are partially removed to form a contact hole that exposes the second conductive pattern 139. In addition, the third to the first insulating interlayers 145, 140 and 130 and the gate insulation layer 120 are etched to form second contact holes that expose the first source and drain regions 112 and 113, and the second source and drain regions 117 and 118. After forming a conductive layer on the third insulating interlayer 145 to fill the contact holes, the conductive layer is patterned to form the first source electrode 152, the first drain electrode 154, the second source electrode 156, the second drain electrode 158, and the first upper wirings 160', 162' and 164'.

According to exemplary embodiments, the first upper wirings 160', 162' and 164' are formed over the first lower wirings 132 and 134 in the peripheral region R. The first upper wirings 160', 162' and 164' do not, in a view substantially perpendicular to an upper face of the substrate 100, substantially overlap the first lower wirings 132 and 134, or overlapping areas between the first upper wirings 160', 162' and 164', and the first lower wirings 132 and 134 are minimized. Thus, parasitic capacitances between the first upper wirings 160', 162' and 164' and the first lower wirings 132 and 134 can be prevented or minimized.

Figure 22:
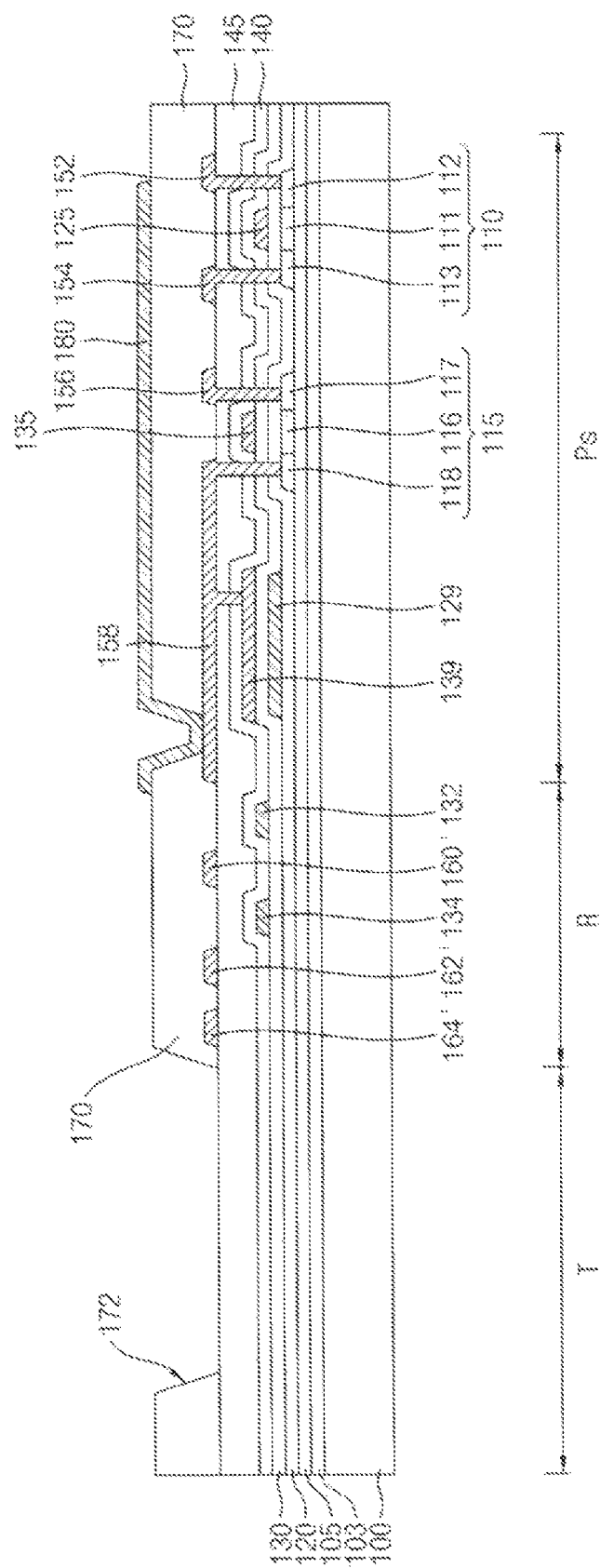

Referring to FIG. 22, in exemplary embodiments, a planarization layer 170 is formed on the third insulating interlayer 145, and then a first electrode 180 is formed on the planarization layer 170. The planarization layer 170 may be formed by a coating process such as a spin coating process using an organic material, such as polyimide, polyester, acryl, etc.

In exemplary embodiments, a transmissive window 172 is formed in a transmissive region T by partially removing the planarization layer 170, and another contact hole that exposes an extension of the second drain electrode 158 is formed in the sub-pixel region Ps by partially removing the planarization layer 170. After forming a conductive layer is formed on the planarization layer 170 and a sidewall of the third contact hole, and the conductive layer is patterned to form a first electrode 180 electrically connected to the second drain electrode 158.

In addition, in exemplary embodiments, a pixel defining layer, a light emitting layer and a second electrode are formed on the first electrode 180 and the planarization layer 170, so an organic light emitting display device having a configuration substantially the same as or similar to that of an organic light emitting display device described with reference to FIG. 6 is provided.

According to exemplary embodiments, an organic light emitting display device may be employed in various electric and electronic apparatuses. For example, an organic light emitting display device can be used in a computer, a notebook, a digital camera, a smart phone, a smart pad, a video camera, a video phone, a portable multimedia player, a persona digital assistant, an MP3 player, an automotive navigation system, a monitoring system, a motion sensing system, a tracking system, an image stabilization system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings of embodiments of the disclosure. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting display device comprising:
   a plurality of pixel regions on a substrate, each including a sub-pixel region, a transmissive region and a peripheral region;
   a plurality of sub-pixel circuits in the sub-pixel region that control the sub-pixel region;
   a planarization layer that covers the plurality of sub-pixel circuits, wherein the planarization layer comprises a transmissive window in the transmissive region;
   a first electrode disposed on the planarization layer in the sub-pixel region;
   a second electrode disposed on the first electrode; and
   a plurality of wirings disposed in at least a double level configuration at different levels over the substrate in the peripheral region.

2. The organic light emitting display device of claim 1, wherein the plurality of wirings comprises:
   first wirings that extend in a first direction over the substrate; and
   second wirings that extend in a second direction over the substrate, the second direction being substantially perpendicular to the first direction, and wherein each sub-pixel circuit includes a plurality of transistors, each transistor including an active pattern, a gate electrode, a source electrode and a drain electrode.

3. The organic light emitting display device of claim 2, wherein the first wirings comprise:
   first lower wirings disposed on an insulating interlayer covering the gate electrode; and
   first upper wirings disposed on the planarization layer.

4. The organic light emitting display device of claim 3, wherein the first upper wirings do not overlap the first lower wirings.

5. The organic light emitting display device of claim 3, wherein the first upper wirings have widths greater than widths of the first lower wirings.

6. The organic light emitting display device of claim 3, wherein the first wirings comprise first additional wirings disposed at a level over the substrate where the gate electrode is disposed.

7. The organic light emitting display device of claim 2, wherein the first wirings comprise:
   first upper wirings disposed an insulating interlayer covering the gate electrode; and
   first lower wirings disposed at a level over the substrate where the gate electrode is disposed,
   wherein the first upper wirings do not overlap the first lower wirings.

8. The organic light emitting display device of claim 2, wherein the first lower wirings are data wirings that transmit data signals to the sub-pixel circuits, and
   wherein the first upper wirings are power supply wirings that supply power to the sub-pixel circuits, or initialization voltage wirings that supply initialization voltages to the sub-pixel circuits.

9. The organic light emitting display device of claim 6, wherein the first additional wirings, the first lower wirings and the first upper wirings are each selected from a group comprising data wirings that transmit data signals to the sub-pixel circuits, power supply wirings that supply power to the sub-pixel circuits, and initialization voltage wirings that supply initialization voltages to the sub-pixel circuits.

10. The organic light emitting display device of claim 2, wherein the second wirings comprise:
    second lower wirings disposed at a level over the substrate where the source and the drain electrodes are disposed; and
    second upper wirings disposed at a level over the substrate where the first electrode is disposed.

11. The organic light emitting display device of claim 10, wherein the second lower wirings are disposed on an insulating interlayer covering the gate electrode, and the second upper wirings are disposed on the planarization layer, and the second upper wirings do not overlap the second lower wirings.

12. The organic light emitting display device of claim 10, wherein the second lower wirings and the second upper wirings are each selected from the group comprising supply wirings that supply power to the sub-pixel circuits, initialization voltage wirings that supply initialization voltages to the sub-pixel circuits, wirings that transmit light emitting signals, wirings that transmit scanning signals, and wirings that transmit gate initialization signals.

13. The organic light emitting display device of claim 1, further comprising a light emitting layer between the first electrode and the second electrode.

14. A method of manufacturing an organic light emitting display device, which comprises:
    providing a substrate having a sub-pixel region, a transmissive region and a peripheral region;
    forming transistors on the substrate in the sub-pixel region, each transistor including an active pattern, a gate electrode, a source electrode and a drain electrode;
    forming a planarization layer on the substrate to cover the transistors;
    partially removing the planarization layer in the transmissive region form a transmissive window;
    forming a first electrode on the planarization layer;
    forming a light emitting layer on the first electrode;
    forming a second electrode on the light emitting layer; and
    forming a plurality of wirings at different levels on the substrate in the peripheral region.

15. The method of claim 14, wherein forming the plurality of wirings comprises:
    forming first wirings that extend along a first direction on the substrate in the peripheral region; and
    forming second wirings that extend along a second direction on the substrate in the peripheral region, the second direction being perpendicular to the first direction.

16. The method of claim 15, wherein the gate electrode is formed on a first insulating interlayer covering the active pattern, and the source and the drain electrodes are formed on a second insulating interlayer covering the gate electrode.

17. The method of claim 16, wherein forming the first wirings comprises:
    forming first lower wirings on the second insulating interlayer; and
    forming first upper wirings on the planarization layer, wherein
    the first lower wirings and the source and the drain electrodes are simultaneously formed, and
    the first upper wirings and the first electrode are simultaneously formed.

18. The method of claim 17, wherein, forming the first wirings further comprises forming first additional wirings on the insulating interlayer, wherein the additional wirings and the gate electrode are simultaneously formed.

19. The method of claim 16, wherein forming the second wirings comprises:
    forming second lower wirings on the insulating interlayer; and
    forming second upper wirings on the planarization layer, wherein
    the second lower wirings and the source and the drain electrodes are simultaneously formed, and
    the second upper wirings and the first electrode are simultaneously formed.

20. An organic light emitting display device comprising:
    a plurality of pixel regions on a substrate, each including a sub-pixel region, a transmissive region and a peripheral region;
    a planarization layer that covers the plurality of sub-pixel circuits, wherein the planarization layer comprises a transmissive window in the transmissive region;
    a first electrode disposed on the planarization layer in the sub-pixel region;
    a second electrode disposed on the first electrode; and
    a plurality of wirings disposed in at least a double level configuration at different levels over the substrate in the peripheral region, wherein the plurality of wirings comprises
    first wirings that extend in a first direction over the substrate, and
    second wirings that extend in a second direction over the substrate, the second direction being substantially perpendicular to the first direction.

21. The organic light emitting display device of claim 20, further comprising
    a plurality of sub-pixel circuits in the sub-pixel region that control the sub-pixel region, wherein each sub-pixel circuit includes a plurality of transistors, each transistor including an active pattern, a gate electrode, a source electrode and a drain electrode; and
    a light emitting layer between the first electrode and the second electrode.

22. The organic light emitting display device of claim 21, wherein the first wirings comprise:
    first lower wirings disposed an insulating interlayer covering the gate electrode; and
    first upper wirings disposed on the planarization layer.

23. The organic light emitting display device of claim 22, wherein the first wirings comprise first additional wirings disposed at a level over the substrate where the gate electrode is disposed.

24. The organic light emitting display device of claim 21, wherein the first wirings comprise:
    first upper wirings disposed an insulating interlayer covering the gate electrode; and
    first lower wirings disposed at a level over the substrate where the gate electrode is disposed,
    wherein the first upper wirings do not overlap the first lower wirings.

25. The organic light emitting display device of claim 21, wherein the second wirings comprise:
    second lower wirings disposed at a level over the substrate where the source and the drain electrodes are disposed; and
    second upper wirings disposed at a level over the substrate where the first electrode is disposed,
    wherein the second lower wirings are disposed on an insulating interlayer covering the gate electrode, and the second upper wirings are disposed on the planarization layer, and the second upper wirings do not overlap the second lower wirings.

* * * * *